US 7,074,673 B2

(12) United States Patent
Forbes

(10) Patent No.: US 7,074,673 B2
(45) Date of Patent: Jul. 11, 2006

(54) SERVICE PROGRAMMABLE LOGIC ARRAYS WITH LOW TUNNEL BARRIER INTERPOLY INSULATORS

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/788,810

(22) Filed: Feb. 27, 2004

(65) Prior Publication Data

US 2004/0168145 A1 Aug. 26, 2004

Related U.S. Application Data

(62) Division of application No. 09/945,512, filed on Aug. 30, 2001.

(51) Int. Cl.
*H01L 21/336* (2006.01)

(52) U.S. Cl. .................. 438/257; 438/259; 438/216; 438/593; 438/592; 438/791; 438/264

(58) Field of Classification Search .................. 438/257, 438/258, 216, 593, 592, 791; 257/316, 321, 257/314, 315; 365/185, 182, 218, 151
See application file for complete search history.

(56) References Cited

U.S. PATENT DOCUMENTS

| | | | |
|---|---|---|---|
| 4,295,150 A | 10/1981 | Adam | 357/54 |
| 4,412,902 A | 11/1983 | Michikami et al. | 204/192 |
| 4,556,975 A | 12/1985 | Smith et al. | |
| 4,672,240 A | 6/1987 | Smith et al. | |
| 4,688,078 A * | 8/1987 | Hseih | 257/321 |
| 4,757,360 A | 7/1988 | Faraone et al. | 357/23.5 |

(Continued)

OTHER PUBLICATIONS

Aarik, Jaan , et al., "Anomalous effect of temperature on atomic layer deposition of titanium oxide", *Journal of Crystal Growth,* (2000),pp. 531–537.

Aarik, Jaan , et al., "Texture development in nanocrystalline hafnium dioxide thin films grown by atomic layer deposition", *Journal of Crystal Growth, 220(1–2),* (2000), 105–113.

Afanas'ev, V , et al., "Electron energy barriers between (100)Si and ultrathin stacks of SiO2, Al2O3, and ZrO3 and ZrO2 insulators", *Applied Physics Letters, 78(20),* (2001), pp. 3073–3075.

Arya, S., et al., "Conduction Properties of Thin Al2O3 Films", *Thin Solid Films, 91,* (1982),363–374.

(Continued)

*Primary Examiner*—B. William Baumeister
*Assistant Examiner*—Igwe U. Anya
(74) *Attorney, Agent, or Firm*—Schwegman, Lundberg, Woessner & Kluth, P.A.

(57) ABSTRACT

Structures and methods for in service programmable logic arrays with low tunnel barrier interpoly insulators are provided. The in-service programmable logic array includes a first logic and a second logic plan having a number of logic cells arranged in rows and columns that are interconnected to produce a number of logical outputs such that the in service programmable logic array implements a logical function. The logic cell includes a first source/drain region and a second source/drain region separated by a channel region in a substrate. A floating gate opposing the channel region and is separated therefrom by a gate oxide. A control gate opposes the floating gate. The control gate is separated from the floating gate by a low tunnel barrier intergate insulator. The low tunnel barrier intergate insulator includes a metal oxide insulator selected from the group consisting of PbO, $Al_2O_3$, $Ta_2O_5$, $TiO_2$, $ZrO_2$, $Nb_2O_5$ and/or a Perovskite oxide tunnel barrier.

31 Claims, 17 Drawing Sheets

U.S. PATENT DOCUMENTS

| | | | |
|---|---|---|---|
| 4,780,424 A | 10/1988 | Holler | 437/29 |
| 4,939,559 A * | 7/1990 | DiMaria et al. | 257/38 |
| 5,042,011 A | 8/1991 | Casper et al. | 365/205 |
| 5,071,782 A | 12/1991 | Mori | 437/48 |
| 5,073,519 A | 12/1991 | Rodder | 438/269 |
| 5,153,880 A | 10/1992 | Owen et al. | |
| 5,280,205 A | 1/1994 | Green et al. | 307/530 |
| 5,350,738 A | 9/1994 | Hase et al. | 505/473 |
| 5,353,431 A | 10/1994 | Doyle et al. | |
| 5,399,516 A | 3/1995 | Bergendahl et al. | 437/43 |
| 5,418,389 A | 5/1995 | Watanabe | 257/295 |
| 5,474,947 A | 12/1995 | Chang et al. | |
| 5,488,612 A * | 1/1996 | Heybruck | 714/725 |
| 5,497,494 A | 3/1996 | Combs et al. | 395/750 |
| 5,498,558 A | 3/1996 | Kapoor | 437/43 |
| 5,508,544 A | 4/1996 | Shah | 257/316 |
| 5,600,592 A | 2/1997 | Atsumi et al. | 365/185.18 |
| 5,618,575 A | 4/1997 | Peter | 427/8 |
| 5,618,761 A | 4/1997 | Eguchi et al. | |
| 5,619,051 A | 4/1997 | Endo | |
| 5,619,642 A | 4/1997 | Nielson et al. | 395/182.04 |
| 5,627,785 A | 5/1997 | Gilliam et al. | 365/189.01 |
| 5,677,867 A | 10/1997 | Hazani | 365/185 |
| 5,691,209 A | 11/1997 | Liberkowski | 437/7 |
| 5,691,230 A | 11/1997 | Forbes | 437/62 |
| 5,739,544 A | 4/1998 | Yuki et al. | 257/25 |
| 5,801,401 A | 9/1998 | Forbes | 257/77 |
| 5,852,306 A | 12/1998 | Forbes | 257/315 |
| 5,880,991 A | 3/1999 | Hsu et al. | 365/182 |
| 5,923,056 A | 7/1999 | Lee et al. | 257/192 |
| 5,936,274 A | 8/1999 | Forbes et al. | 257/315 |
| 5,952,692 A | 9/1999 | Nakazato et al. | 257/321 |
| 5,959,465 A * | 9/1999 | Beat | 326/39 |
| 5,973,355 A | 10/1999 | Shirai et al. | |
| 5,981,350 A | 11/1999 | Geusic et al. | 438/386 |
| 5,986,932 A | 11/1999 | Ratnakumar et al. | 365/185.07 |
| 5,991,225 A | 11/1999 | Forbes et al. | 365/230.06 |
| 6,009,011 A | 12/1999 | Yamauchi | |
| 6,025,228 A | 2/2000 | Ibok et al. | 438/261 |
| 6,025,627 A | 2/2000 | Forbes et al. | 257/321 |
| 6,031,263 A | 2/2000 | Forbes et al. | 257/315 |
| 6,069,380 A | 5/2000 | Chou et al. | 257/315 |
| 6,069,816 A | 5/2000 | Nishimura | 365/185 |
| 6,077,745 A | 6/2000 | Burns, Jr. et al. | 438/270 |
| 6,124,729 A * | 9/2000 | Noble et al. | 326/41 |
| 6,134,175 A | 10/2000 | Forbes et al. | 365/230.06 |
| 6,135,175 A | 10/2000 | Gaudreault et al. | 144/4.1 |
| 6,141,238 A | 10/2000 | Forbes et al. | 365/145 |
| 6,141,248 A | 10/2000 | Forbes et al. | 365/185.08 |
| 6,143,636 A | 11/2000 | Forbes et al. | 438/587 |
| 6,153,468 A | 11/2000 | Forbes et al. | 438/257 |
| 6,163,049 A * | 12/2000 | Bui | 257/321 |
| 6,169,306 B1 | 1/2001 | Gardner et al. | 257/310 |
| 6,208,164 B1 | 3/2001 | Noble et al. | 326/41 |
| 6,210,999 B1 | 4/2001 | Gardner et al. | 438/183 |
| 6,229,175 B1 | 5/2001 | Uchida | 257/315 |
| 6,238,976 B1 | 5/2001 | Noble et al. | 438/259 |
| 6,246,606 B1 | 6/2001 | Forbes et al. | 365/185.03 |
| 6,249,020 B1 | 6/2001 | Forbes et al. | 257/315 |
| 6,249,460 B1 | 6/2001 | Forbes et al. | 365/185.28 |
| 6,306,708 B1 | 10/2001 | Peng | 438/266 |
| 6,307,775 B1 | 10/2001 | Forbes et al. | 365/185.01 |
| 6,317,364 B1 | 11/2001 | Guterman et al. | |
| 6,323,844 B1 | 11/2001 | Yeh et al. | 345/166 |
| 6,341,084 B1 | 1/2002 | Numata et al. | |
| 6,351,411 B1 | 2/2002 | Forbes et al. | 365/182 |
| 6,377,070 B1 * | 4/2002 | Forbes | 326/41 |
| 6,424,001 B1 | 7/2002 | Forbes et al. | 257/315 |
| 6,433,382 B1 | 8/2002 | Orlowski et al. | 257/315 |
| 6,461,931 B1 | 10/2002 | Eldridge | 438/398 |
| 6,475,857 B1 | 11/2002 | Kim et al. | 438/240 |
| 6,504,207 B1 | 1/2003 | Chen et al. | |
| 6,514,842 B1 * | 2/2003 | Prall et al. | 438/593 |
| 6,521,943 B1 | 2/2003 | Mine et al. | |
| 6,541,280 B1 | 4/2003 | Kaushik et al. | 438/3 |
| 6,574,143 B1 | 6/2003 | Nakazato | |
| 6,586,797 B1 | 7/2003 | Forbes et al. | 257/325 |
| 6,730,575 B1 | 5/2004 | Eldridge | |
| 6,740,928 B1 | 5/2004 | Yoshii et al. | |
| 6,754,108 B1 | 6/2004 | Forbes | |
| 6,778,441 B1 | 8/2004 | Forbes et al. | |
| 6,950,340 B1 | 9/2005 | Bhattacharyya | |
| 6,952,032 B1 | 10/2005 | Forbes et al. | |
| 2001/0013621 A1 | 8/2001 | Nakazato | 257/314 |
| 2001/0055838 A1 | 12/2001 | Walker et al. | 438/129 |
| 2002/0008324 A1 | 1/2002 | Shinkawata | |
| 2002/0028541 A1 * | 3/2002 | Lee et al. | 438/149 |
| 2002/0106536 A1 | 8/2002 | Lee et al. | 428/702 |
| 2002/0109138 A1 | 8/2002 | Forbes | |
| 2002/0137250 A1 | 9/2002 | Nguyen et al. | 438/53 |
| 2003/0043637 A1 | 3/2003 | Forbes et al. | |
| 2003/0207032 A1 | 11/2003 | Ahn et al. | |
| 2003/0207540 A1 | 11/2003 | Ahn et al. | |
| 2005/0023595 A1 | 2/2005 | Forbes et al. | |
| 2005/0023602 A1 | 2/2005 | Forbes et al. | |
| 2005/0023603 A1 | 2/2005 | Eldridge et al. | |
| 2005/0024945 A1 | 2/2005 | Forbes | |
| 2005/0026349 A1 | 2/2005 | Forbes et al. | |
| 2005/0169054 A1 | 8/2005 | Forbes | |

OTHER PUBLICATIONS

Dipert, Brian, "Flash Memory Goes Mainstream", *IEEE Spectrum, 30, (10)*, (Oct. 1993), 48–52.

Eierdal, L., et al., "Interaction of oxygen with Ni(110) studied by scanning tunneling microscopy", *Surface Science, 312*, (1994),pp. 31–53.

Eldridge, J., et al., "Analysis of Ultrathin Oxide Growth on Indium", *thin Solid Films, 12*, (1972),pp. 447–451.

Eldridge, J. M., et al., "Growth of Thin PbO Layers on Lead Films", *Surface Science, 40*, (1973),512–530.

Eldridge, J., et al., "Measurement of Tunnel Current Density in a Metal–Oxide–Metal System as a Function of Oxide Thickness", *Proc. 12th Intern. Conf. on Low Temperature Physics*, (1971),427–428.

Ferguson, J D., et al., "Atomic layer deposition of Al2O3 and SiO2 on BN particles using sequential surface reaction", *Applied Surface Science*, (2000),pp. 280–292.

Greiner, J., "Josephson Tunneling Barriers by rf Sputter Etching in an Oxygen Plasma", *Journal of Applied Physics, 42(12)*, (Nov. 1971),5151–5155.

Greiner, J., "Oxidation of lead films by rf sputter etching in an oxygen plasma", *Journal of Applied Physics, 45(1)*, (1974),32–37.

Grimblot, J., et al., "I. Interaction of Al films with O2 at low pressures", *J. Electro. Chem. Soc.*, vol. 129, No. 10,(1982), pp. 2366–2368.

Grimblot, J., et al., "II. Oxidation of Aluminum Films", *J. Electrochem., 129*, (1982),pp. 2369–2372.

Gundlach, K., "Logarithmic Conductivity of Al–Al2O3–Al Tunneling Junctions Produced by Plasma and by Thermal Oxidation", *Surface Science, 27*, (1971),125–141.

Guo, X., "High Quality Ultra–thin (1.5 nm) TiO2/Si3N4 Gate Dielectric for Deep Sub–micron CMOS Technology", *IEDM Technical Digest*, (1999),pp. 137–140.

Hodges, D. A., *Analysis and Design of Digital Integrated Circuits, 2nd Edition*, McGraw–Hill Publishing. New York, (1988),pp. 354–357 and 394–396.

Hurych, Z., "Influence of Non–Uniform Thickness of Dielectric Layers on Capacitance and Tunnel Currents", *Solid–State Electronics, vol. 9,* (1966),967–979.

Itokawa, H , "Determination of Bandgap and Energy Band Alignment for High–Dielectric–Constant Gate Insulators Using High–Resolution X–ray Photoelectron Spectroscopy", *Extended Abstracts of the 1999 International Conference on Solid State Devices and Materials,* (1999),pp. 158–159.

Kim, Yong S., et al., "Effect of rapid thermal annealing on the structure and the electrical properties of atomic–layer–deposited Ta2O5 films", *Journal of the Korean Physical Society,* (Dec. 2000),pp. 975–979.

Kim, H. , "Leakage current and electrical breakdown in metal–organic chemical vapor deposited TiO2 dielectrics on silicon substrates", *Applied Phys. Lett., 69(25),* (1996),pp. 3860–3862.

Kim, Yeong K., et al., "Novel capacitor technology for high density stand–alone and embedded DRAMs", *IEDM,* (2000),pp. 369–372.

Kubaschewski, O. , et al., *Oxidation of Metals and Alloys, Second Edition,* Butterworths, London,(1962),pp. 1–3, 5,6, 8–12, 24, 36–39 and 53–63.

Kukli, Kaupo , "Atomic Layer Deposition of Titanium Oxide from TiI4 and H2O2", *Chemical Vapor Deposition, 6(6),* (2000),303–310.

Kukli, Kaupo , et al., "Atomic layer deposition of zirconium oxide from zirconium tetraiodide, water and hydrogen peroxide", *Journal of Crystal Growth,* (2001),pp. 262–272.

Kukli, K. , "Development of Dielectric Properties of Niobium Oxide, Tantalum Oxide, and Aluminum Oxide Based Nanolayered Materials", *Journal of the Electrochemical Society, 148(2),* (2001),pp. F35–F41.

Kukli, Kaupo , et al., "Real–time monitoring in atomic layer deposition of TiO2 from TiI4and H2O–H2O2", *American Chemical Society,* (2000),pp. 8122–8128.

Kwo, J. , "Properties of high k gate dielectrics Gd2O3 and Y2O3 for Si", *Journal of Applied Physics,89(7),* (2001),pp. 3920–3927.

Lee, J. , et al., "Effect of Polysilicon Gate on the Flatband Voltage Shift and Mobility Degradation for ALD–Al2O3 Gate Dielectric", *IEDM,* (2000),pp. 645–648.

Luan, H. F., "High Quality Ta2O5 Gate Dielectrics with Tox,eq<10A", *IEDM Technical Digest. International Electron Devices Meeting,* (Dec. 5–8, 1999),141–143.

Ma, Y. , et al., "Zirconium Oxide Based Gate Dielectrics with equivalents Oxide Thickness of LEss than 1.0 nm and Performance of Submicron MOSFET using a Nitride Gate Replacement Process", *IEDM—Technical Digest,* (1999), pp. 149–152.

Marshalek, R. , et al., "Photoresponse Characteristics of Thin–Film Nickel–Nickel Oxide–Nickel Tunneling Junctions", *IEEE Journal of Quantum Electronics, QE–19(4),* (1983),pp. 743–754.

Masuoka, F. , et al., "A 256K Flash EEPROM using Triple Polysilicon Technology", *IEEE International Solid–State Circuits Conference, Digest of Technical Papers,* (1985), 168–169.

Masuoka, F. , et al., "A New Flash EEPROM Cell using Triple Polysilicon Technology", *International Electron Devices Meeting, Technical Digest,* San Francisco, CA,(1984),464–467.

Mori, S. , et al., "Reliable CVD Inter–Poly Dielectrics for Advanced E&EEPROM", *Symposium on VSLI Technology. Digest of Technical Papers,* (1985), 16–17.

Muller, H. , "Electrical and Optical Properties of Sputtered In2O3 Films", *Physica Status Solidi, 27(2),* (1968),pp. 723–731.

Paranjpe, Ajit , et al., "Atomic layer deposition of AlOx for thin film head gap applications", *Journal of the Electrochemical Society,* (Sep. 2001),pp. 465–471.

Pashley, R. , "Flash Memories: the best of two worlds", *IEEE Spectrum, 26(12),* (Dec. 1989),30–33.

Pollack, S. , et al., "Tunneling Through Gaseous Oxidized Films of Al2O3", *Transactions of the Metallurgical Society of AIME, 233,* (1965),pp. 497–501.

Qi, W , "MOSCAP and MOSFET characteristics using ZrO2 gate dielectric deposited directly on Si", *IEDM—Technical Digest,* (1999), 145–148.

Robertson, J., "Band offsets of wide–band–gap oxides and implications for future electronic devices", *Journal Vacuum Science & Technology B (Microelectronics and Nanometer Structures), 18(3),* (May–Jun. 2000),1785–1791.

Robertson, J., et al., "Schottky Barrier height of Tantalum oxide, barium strontium–titanate, lead titanate, and strontium bismuth tantalate", *Applied Physics Letters, vol. 74, No. 8,* (Feb. 22, 1999),1168–1170.

Shi, Y. , "Tunneling Leakage Current in Ultrathin (<4 nm) Nitride/Oxide Stack Dielectrics", *IEEE Electron Device Letters, 19(10),* (Oct. 1998),pp. 388–390.

Simmons, J., "Generalized Formula for the Electric Tunnel Effect between Similar Electrodes Separated by a Thin Insulating Film", *Journal of Applied Physics, 34(6),* (1963), 1793–1803.

Smith, Ryan C., et al., "Chemical vapour deposition of the oxides of titanium, zirconium and hafnium for use as high–k materials in microelectronic devices. A carbon–free precursor for the synthesis if hafnium dioxide", *Advanced Materials for Optics and Electronics,* (2000),pp. 105–106.

Swalin, R. , "Equilibrium between Phases of Variable Composition", *Thermodynamics of Solids, 2nd Edition,* (1972), pp. 165–180.

Sze, S. , "Physics of Semiconductor Devices, Second Edition", *John Wiley & Sons, New York,* (1981),pp. 553–556.

Yan, J. , et al., "Structural and electrical characterization of TiO2 grown from titanium tetrakis–isopropoxide (TTIP) and TTIP/H2O ambients", *Journal Vac. Sci. Technol. B, 14(3),* (1996),pp. 1706–1711.

Zhang, H. , et al., "Atomic Layer Deposition of High Dielectric Constant Nanolaminates", *Journal of The Electrochemical Society,* 148(4),(2001),F63–F66.

* cited by examiner

SERVICE PROGRAMMABLE LOGIC ARRAYS WITH LOW TUNNEL BARRIER INTERPOLY INSULATORS

RELATED APPLICATIONS

This application is a divisional of U.S. application Ser. No. 09/945,512 filed on Aug. 30, 2001 which is incorporated herein by reference.

CROSS REFERENCE TO RELATED APPLICATIONS

This application is related to the following co-pending, commonly assigned U.S. patent applications: "DRAM Cells with Repressed Memory Metal Oxide Tunnel Insulators," Ser. No. 09/945,395, "Programmable Array Logic or Memory Devices with Asymmetrical Tunnel Barriers," Ser. No. 09/943,134, "Dynamic Electrically Alterable Programmable Memory with Insulating Metal Oxide Interpoly Insulators," Ser. No. 09/945,498, and "Flash Memory with Low Tunnel Barrier Interpoly Insulators," Ser. No. 09/945,507, "SRAM Cells with Repressed Floating Gate Memory, Metal Oxide Tunnel Interpoly Insulators," Ser. No. 09/945,554, "Programmable Memory Address and Decode Devices with Low Tunnel Barrier Interpoly Insulators," Ser. No. 09/945,500, which are filed on even date herewith and each of which disclosure is herein incorporated by reference.

FIELD OF THE INVENTION

The present invention relates generally to integrated circuits, and in particular to in-service programmable logic arrays with low tunnel barrier interpoly insulators.

BACKGROUND OF THE INVENTION

Logic circuits are an integral part of digital systems, such as computers. Essentially, a logic circuit processes a number of inputs to produce a number of outputs for use by the digital system. The inputs and outputs are generally electronic signals that take on one of two "binary" values, a "high" logic value or a "low" logic value. The logic circuit manipulates the inputs using binary logic which describes, in a mathematical way, a given or desired relationship between the inputs and the outputs of the logic circuit.

Logic circuits that are tailored to the specific needs of a particular customer can be very expensive to fabricate on a commercial basis. Thus, general purpose very large scale integration (VLSI) circuits are defined. VLSI circuits serve as many logic roles as possible, which helps to consolidate desired logic functions. However, random logic circuits are still required to tie the various elements of a digital system together.

Several schemes are used to implement these random logic circuits. One solution is standard logic, such as transistor-transistor logic (TTL). TTL integrated circuits are versatile because they integrate only a relatively small number of commonly used logic functions. The drawback is that large numbers of TTL integrated circuits are typically required for a specific application. This increases the consumption of power and board space, and drives up the overall cost of the digital system.

One alternative to standard logic is fully custom logic integrated circuits. Custom logic circuits are precisely tailored to the needs of a specific application. This allows the implementation of specific circuit architectures that dramatically reduces the number of parts required for a system. However, custom logic devices require significantly greater engineering time and effort, which increases the cost to develop these circuits and may also delay the production of the end system.

A less expensive alternative to custom logic is the "programmable logic array." Programmable logic arrays take advantage of the fact that complex combinational logic functions can be reduced and simplified into various standard forms. For example, logical functions can be manipulated and reduced down to traditional Sum of Products (SOP) form. In SOP form, a logical function uses just two types of logic functions that are implemented sequentially. This is referred to as two-level logic and can be implemented with various conventional logic functions, e.g., AND-OR, NAND-NAND, NOR-NOR.

One benefit of the programmable logic array is that it provides a regular, systematic approach to the design of random, combinational logic circuits. A multitude of logical functions can be created from a common building block, e.g., an array of transistors. The logic array is customized or "programmed" by creating a specific metallization pattern to interconnect the various transistors in the array to implement the desired function.

Programmable logic arrays are fabricated using photolithographic techniques that allow semiconductor and other materials to be manipulated to form integrated circuits as is known in the art. These photolithographic techniques essentially use light that is focused through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a programmable logic array. In order to keep up with the demands for larger programmable logic arrays, designers search for ways to reduce the size of the components of the array.

As the density requirements become higher and higher in logic and memories it becomes more and more crucial to minimize device area. The programmable logic array (PLA) circuit in the NOR-NOR configuration is one example of an architecture for implementing logic circuits.

Flash memory cells are one possible solution for high density memory requirements. Flash memories include a single transistor, and with high densities would have the capability of replacing hard disk drive data storage in computer systems. This would result in delicate mechanical systems being replaced by rugged, small and durable solid-state memory packages, and constitute a significant advantage in computer systems. What is required then is a flash memory with the highest possible density or smallest possible cell area.

Flash memories have become widely accepted in a variety of applications ranging from personal computers, to digital cameras and wireless phones. Both INTEL and AMD have separately each produced about one billion integrated circuit chips in this technology.

The original EEPROM or EARPROM and flash memory devices described by Toshiba in 1984 used the interplay dielectric insulator for erase. (See generally, F. Masuoka et al., "A new flash EEPROM cell using triple polysilicon technology," IEEE Int. Electron Devices Meeting, San Francisco, pp. 464–67, 1984; F. Masuoka et al., "256K flash EEPROM using triple polysilicon technology," IEEE Solid-State Circuits Conf., Philadelphia, pp. 168–169, 1985). Various combinations of silicon oxide and silicon nitride were tried. (See generally, S. Mori et al., "reliable CVD inter-poly dialectics for advanced E&EEPROM," Symp. On VLSI Technology, Kobe, Japan, pp. 16–17, 1985). However, the rough top surface of the polysilicon floating gate resulted in, poor quality interpoly oxides, sharp points, localized high electric fields, premature breakdown and reliability problems.

Widespread use of flash memories did not occur until the introduction of the ETOX cell by INTEL in 1988. (See generally, U.S. Pat. No. 4,780,424, "Process for fabricating electrically alterable floating gate memory devices," 25 Oct. 1988; B. Dipert and L. Hebert, "Flash memory goes mainstream," IEEE Spectrum, pp. 48–51, October, 1993; R. D. Pashley and S. K. Lai, "Flash memories, the best of two worlds," IEEE Spectrum, pp. 30–33, December 1989). This extremely simple cell and device structure resulted in high densities, high yield in production and low cost. This enabled the widespread use and application of flash memories anywhere a non-volatile memory function is required. However, in order to enable a reasonable write speed the ETOX cell uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Other approaches to resolve the above described problems include; the use of different floating gate materials, e.g. SiC, SiOC, GaN, and GaAlN, which exhibit a lower work function (see FIG. 1A), the use of structured surfaces which increase the localized electric fields (see FIG. 1B), and amorphous SiC gate insulators with larger electron affinity, $\chi$, to increase the tunneling probability and reduce erase time (see FIG. 1C).

One example of the use of different floating gate (FIG. 1A) materials is provided in U.S. Pat. No. 5,801,401 by L. Forbes, entitled "FLASH MEMORY WITH MICROCRYSTALLINE SILICON CARBIDE AS THE FLOATING GATE STRUCTURE." Another example is provided in U.S. Pat. No. 5,852,306 by L. Forbes, entitled "FLASH MEMORY WITH NANOCRYSTALLINE SILICON FILM AS THE FLOATING GATE." Still further examples of this approach are provided in pending applications by L. Forbes and K. Ahn, entitled "DYNAMIC RANDOM ACCESS MEMORY OPERATION OF A FLASH MEMORY DEVICE WITH CHARGE STORAGE ON A LOW ELECTRON AFFINITY GaN OR GaAlN FLOATING GATE," Ser. No. 08/908098, and "VARIABLE ELECTRON AFFINITY DIAMOND-LIKE COMPOUNDS FOR GATES IN SILICON CMOS MEMORIES AND IMAGING DEVICES," Ser. No. 08/903452.

An example of the use of the structured surface approach (FIG. 1B) is provided in U.S. Pat. no. 5,981,350 by J. Geusic, L. Forbes, and K. Y. Ahn, entitled "DRAM CELLS WITH A STRUCTURE SURFACE USING A SELF STRUCTURED MASK." Another example is provided in U.S. Pat. No. 6,025,627 by L. Forbes and J. Geusic, entitled "ATOMIC LAYER EXPITAXY GATE INSULATORS AND TEXTURED SURFACES FOR LOW VOLTAGE FLASH MEMORIES."

Finally, an example of the use of amorphous SiC gate insulators (FIG. 1C) is provided in U.S. patent application Ser. No. 08/903453 by L. Forbes and K. Ahn, entitled "GATE INSULATOR FOR SILICON INTEGRATED CIRCUIT TECHNOLOGY BY THE CARBURIZATION OF SILICON."

Additionally, graded composition insulators to increase the tunneling probability and reduce erase time have been described by the same inventors. (See, L. Forbes and J. M. Eldridge, "GRADED COMPOSITION GATE INSULATORS TO REDUCE TUNNELING BARRIERS IN FLASH MEMORY DEVICES," application Ser. No. 09/945,514.

However, all of these approaches relate to increasing tunneling between the floating gate and the substrate such as is employed in a conventional ETOX device and do not involve tunneling between the control gate and floating gate through and inter-poly dielectric.

Therefore, there is a need in the art to provide improved in service programmable logic arrays. The in-service programmable logic arrays should provide improved flash memory densities while avoiding the large barriers to electron tunneling or hot electron injection presented by the silicon oxide-silicon interface, 3.2 eV, which result in slow write and erase speeds even at very high electric fields. There is also a need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach, the above mentioned problems of having a rough top surface on the polysilicon floating gate which results in, poor quality interpoly oxides, sharp points, localized high electric fields, premature breakdown and reliability problems must be avoided.

SUMMARY OF THE INVENTION

The above mentioned problems with in service programmable logic arrays and other problems are addressed by the present invention and will be understood by reading and studying the following specification. Systems and methods are provided for in service programmable logic arrays using logic cells, or non-volatile memory cells with metal oxide and/or low tunnel barrier interpoly insulators.

In one embodiment of the present invention, in service programmable logic arrays with ultra thin vertical body transistors are provided. The in-service programmable logic array includes a first logic plane that receives a number of input signals. The first logic plane has a plurality of logic cells arranged in rows and columns that are interconnected to provide a number of logical outputs. A second logic plane has a number of logic cells arranged in rows and columns that receive the outputs of the first logic plane and that are interconnected to produce a number of logical outputs such that the in service programmable logic array implements a logical function. Each of the logic cells includes includes a first source/drain region and a second source/drain region separated by a channel region in a substrate. A floating gate opposing the channel region and is separated therefrom by a gate oxide. A control gate opposes the floating gate. The control gate is separated from the floating gate by a low tunnel barrier intergate insulator. The low tunnel barrier intergate insulator includes a metal oxide insulator selected from the group consisting of PbO, $Al_2O_3$, $Ta_2O_5$, $TiO_2$, $ZrO_2$, and $Nb_2O_5$. The floating gate includes a polysilicon floating gate having a metal layer formed thereon in contact with the low tunnel barrier intergate insulator. And, the control gate includes a polysilicon control gate having a metal layer formed thereon in contact with the low tunnel barrier intergate insulator.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1A:
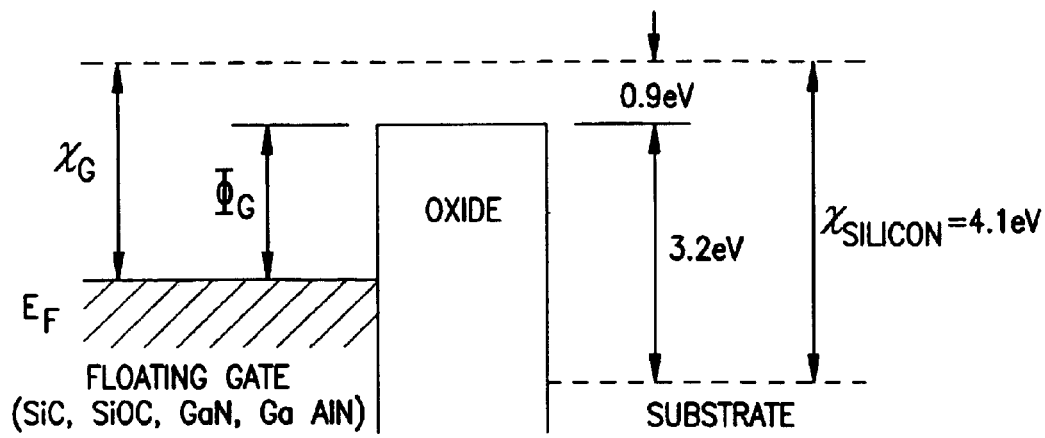
FIGS. 1A–1C illustrate a number of previous methods for reducing tunneling barriers in Flash memory.
Figure 1B:
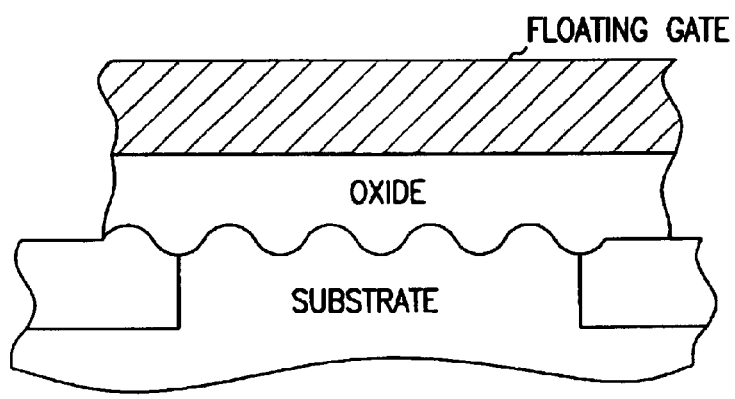
Figure 1C:
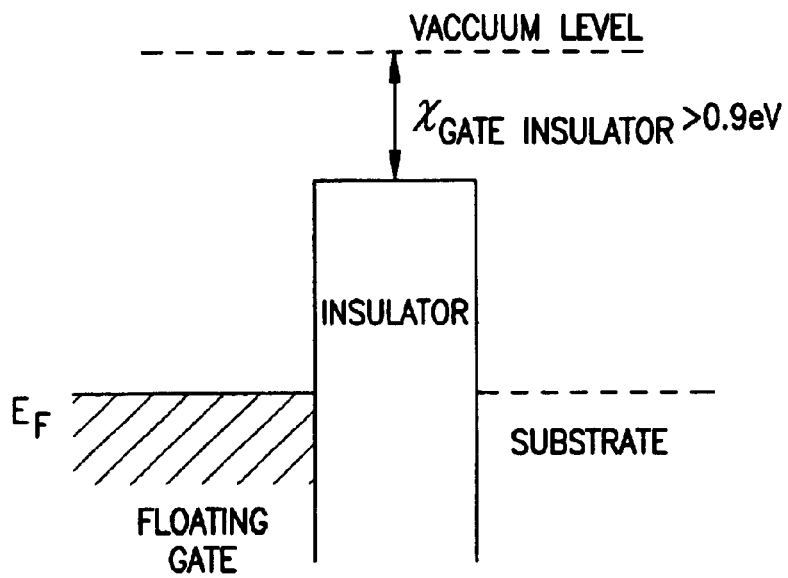
Figure 2:
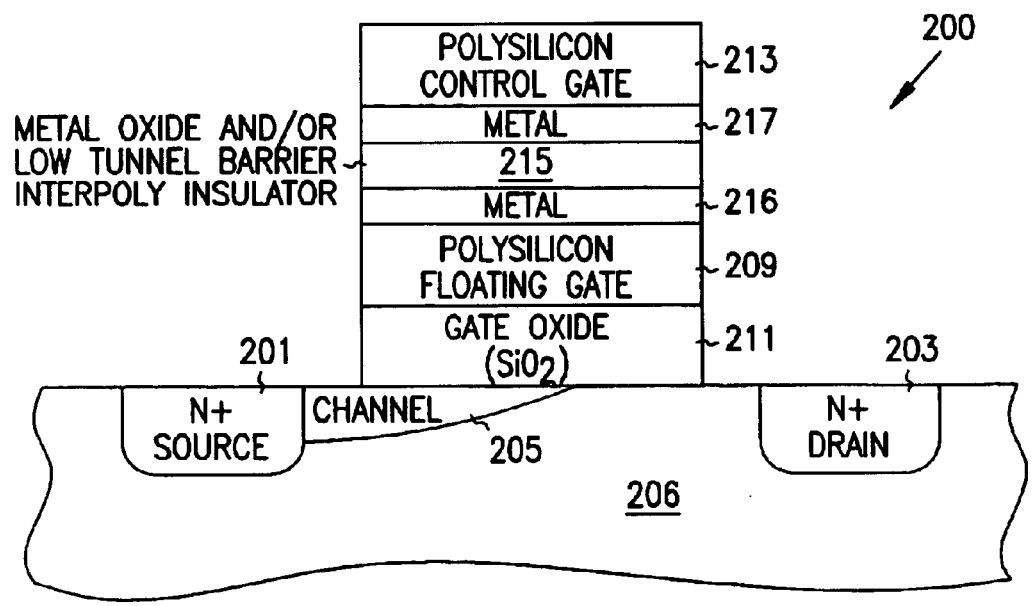
FIG. 2 illustrates one embodiment of a floating gate transistor, or non-volatile memory cell, according to the teachings of the present invention.

The present invention, describes the use of metal oxide inter-poly dielectric insulators between the control gate and the floating gate. An example is shown in FIG. 2 for a planar structure, or horizontal non-volatile memory cell. According to the teachings of the present invention. The use of metal oxide films for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by oxidizing layered metal film compositions in order, for example, to enhance device yields and reliability more typical of single insulating layers.

(ix) Eliminating soft erase errors caused by the current technique of tunnel erase from floating gate to the source.

FIG. 2 illustrates one embodiment of a floating gate transistor, or non-volatile memory cell 200, according to the teachings of the present invention. As shown in FIG. 2, the non-volatile memory cell 200 includes a first source/drain region 201 and a second source/drain region 203 separated by a channel region 205 in a substrate 206. A floating gate 209 opposes the channel region 205 and is separated therefrom by a gate oxide 211. A control gate 213 opposes the floating gate 209. According to the teachings of the present invention, the control gate 213 is separated from the floating gate 209 by a low tunnel barrier intergate insulator 215.

In one embodiment of the present invention, low tunnel barrier intergate insulator 215 includes a metal oxide insulator selected from the group consisting of lead oxide (PbO) and aluminum oxide ($Al_2O_3$). In an alternative embodiment of the present invention, the low tunnel barrier intergate insulator 215 includes a transition metal oxide and the transition metal oxide is selected from the group consisting of $Ta_2O_5$, $TiO_2$, $ZrO_2$, and $Nb_2O_5$. In still another alternative embodiment of the present invention, the low tunnel barrier intergate insulator 215 includes a Perovskite oxide tunnel barrier.

According to the teachings of the present invention, the floating gate 209 includes a polysilicon floating gate 209 having a metal layer 216 formed thereon in contact with the low tunnel barrier intergate insulator 215. Likewise, the control gate 213 includes a polysilicon control gate 213 having a metal layer 217 formed thereon in contact with the low tunnel barrier intergate insulator 215. In this invention, the metal layers, 216 and 217, are formed of the same metal material used to form the metal oxide interpoly insulator 215.

Figure 3:
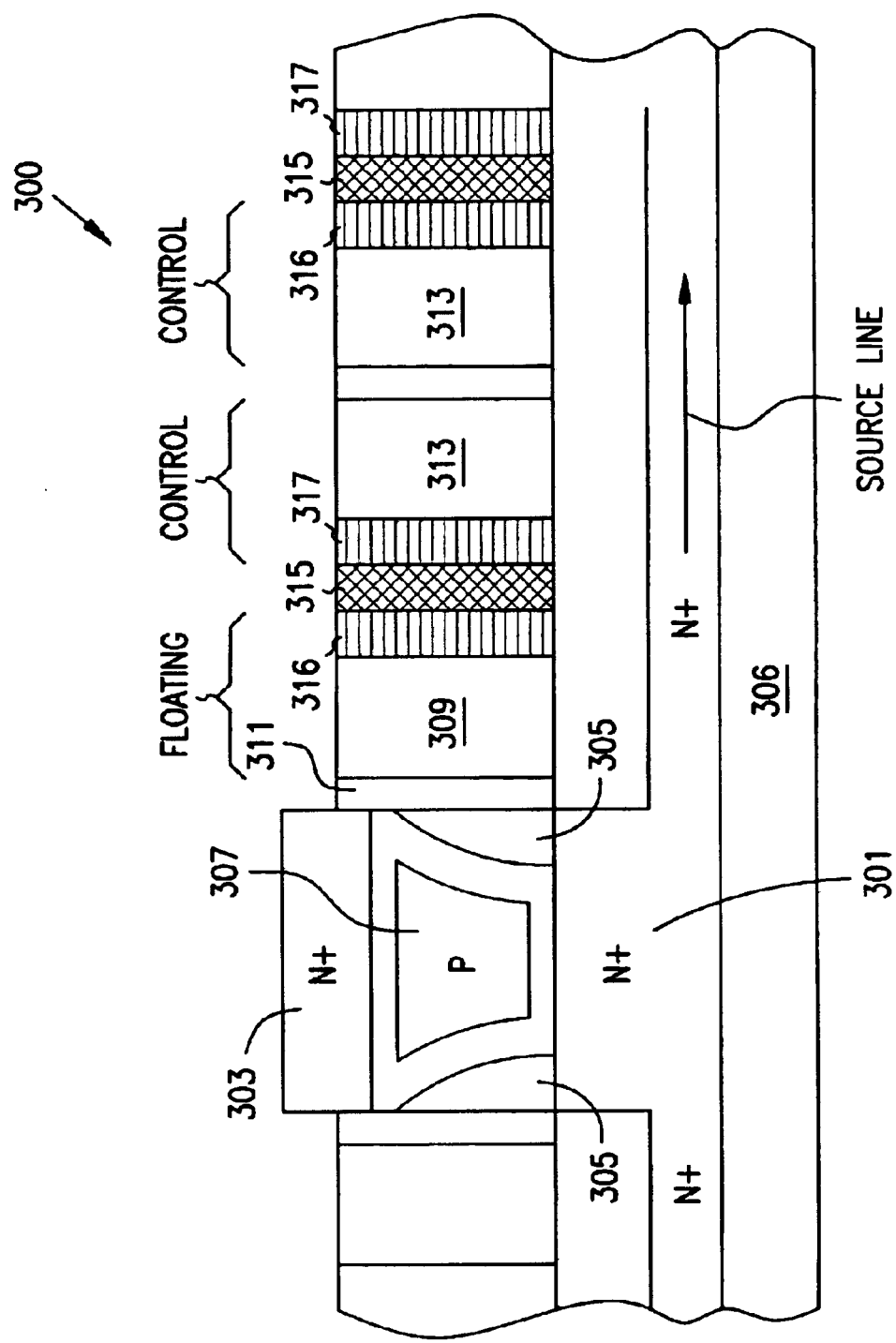
FIG. 3 illustrates another embodiment of a floating gate transistor, or non-volatile memory cell, according to the teachings of the present invention.

FIG. 3 illustrates another embodiment of a floating gate transistor, or non-volatile memory cell 300, according to the teachings of the present invention. As shown in the embodiment of FIG. 3, the non-volatile memory cell 300 includes a vertical non volatile memory cell 300. In this embodiment, the non-volatile memory cell 300 has a first source/drain region 301 formed on a substrate 306. A body region 307 including a channel region 305 is formed on the first source/drain region 301. A second source/drain region 303 is formed on the body region 307. A floating gate 309 opposes the channel region 305 and is separated therefrom by a gate oxide 311. A control gate 313 opposes the floating gate 309. According to the teachings of the present invention, the control gate 313 is separated from the floating gate 309 by a low tunnel barrier intergate insulator 315.

According to the teachings of the present invention, the low tunnel barrier intergate insulator 315 includes a metal oxide insulator 315 selected from the group consisting of PbO, $Al_2O_3$, $Ta_2O_5$, $TiO_2$, $ZrO_2$, and $Nb_2O_5$. In still another alternative embodiment of the present invention, the low tunnel barrier intergate insulator 315 includes a Perovskite oxide tunnel barrier. The floating gate 309 includes a polysilicon floating gate 309 having a metal layer 316 formed thereon in contact with the low tunnel barrier intergate insulator 315. The control gate 313 includes a polysilicon control gate 313 having a metal layer 317 formed thereon in contact with, the low tunnel barrier intergate insulator 315.

As shown in FIG. 3, the floating gate 309 includes a vertical floating gate 309 formed alongside of the body region 307. In the embodiment shown in FIG. 3, the control gate 313 includes a vertical control gate 313 formed alongside of the vertical floating gate 309.

As will be explained in more detail below, the floating gate 309 and control gate 313 orientation shown in FIG. 3 is just one embodiment for a vertical non volatile memory cell 300, according to the teachings of the present invention.

In other embodiments, explained below, the floating gate includes a horizontally oriented floating gate formed alongside of the body region. In this alternative embodiment, the control gate includes a horizontally oriented control gate formed above the horizontally oriented floating gate.

Figure 4:
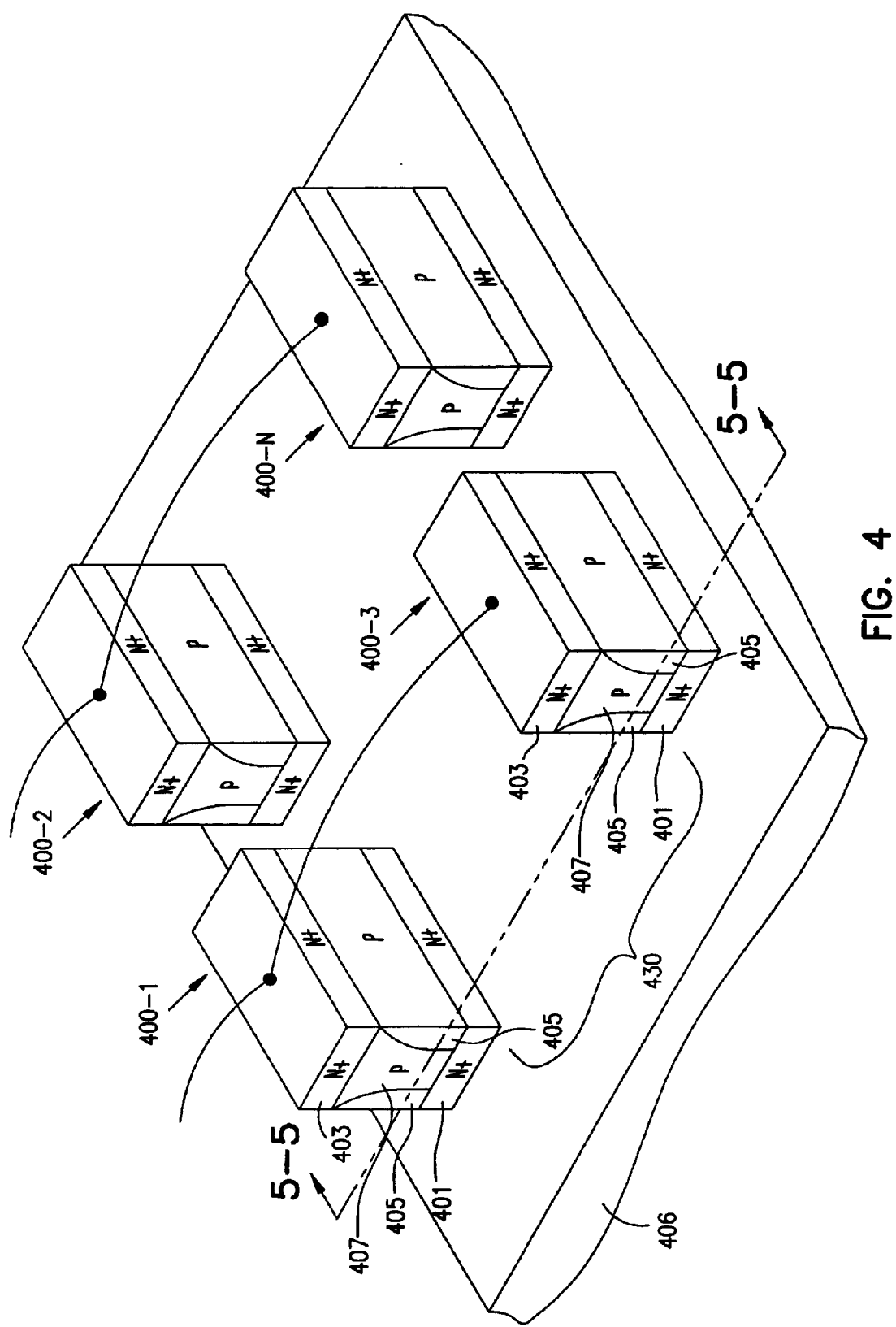
FIG. 4 is a perspective view illustrating an array of silicon pillars formed on a substrate as used in one embodiment according to the teachings of the present invention.

FIG. 4 is a perspective view illustrating an array of silicon pillars 400-1, 400-2, 400-3, . . . , 400-N, formed on a substrate 406 as used in one embodiment according to the teachings of the present invention. As will be understood by one of ordinary skill in the art upon reading this disclosure, the substrates can be (i) conventional p-type bulk silicon or p-type epitaxial layers on p+wafers, (ii) silicon on insulator formed by conventional SIMOX, wafer bonding and etch back or silicon on sapphire, or (iii) small islands of silicon on insulator utilizing techniques.

As shown in FIG. 4, each pillar in the array of silicon pillars 400-1, 400-2, 400-3, . . . , 400-N, includes a first source/drain region 401 and a second source/drain region 403. The first and the second source/drain regions, 401 and 403, are separated by a body region 407 including channel regions 405. As shown in FIG. 4, a number of trenches 430 separate adjacent pillars in the array of silicon pillars 400-1, 400-2, 400-3, . . . , 400-N. Trenches 430 are referenced in connection with the discussion which follows in connection with FIGS. 5A–5E.

Figure 5A:
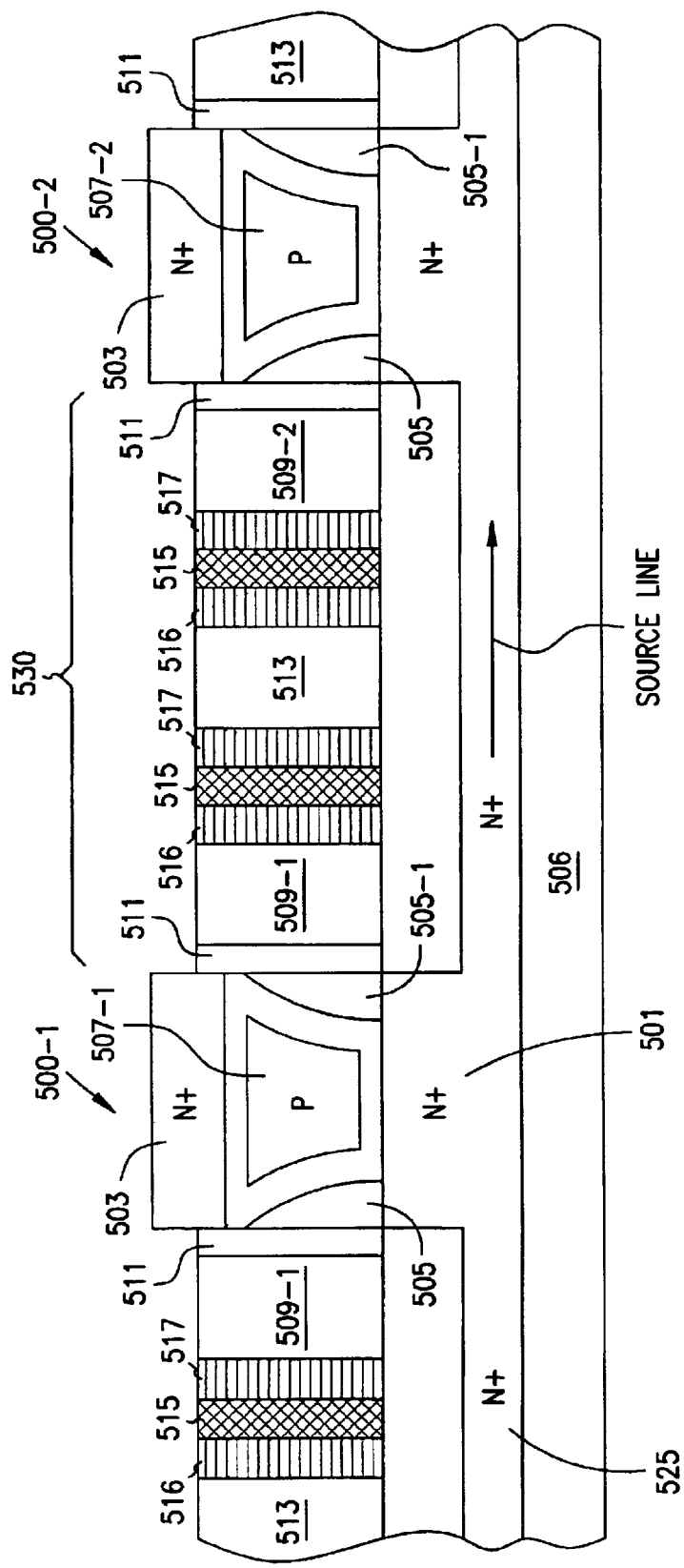
FIGS. 5A–5E are cross sectional views taken along cut line 5—5 from FIG. 4 illustrating a number of floating gate and control gate configurations which are included in the scope of the present invention.

FIGS. 5A–5E are cross sectional views taken along cut line 5—5 from FIG. 4. As mentioned above in connection with FIG. 3, a number of floating gate and control gate configurations are included in the present invention. FIG. 5A illustrates one such embodiment of the present invention. FIG. 5A illustrates a first source/drain region 501 and second source/drain region 503 for a non-volatile memory cell 500 formed according to the teachings of the present invention. As shown in FIG. 5, the first and second source/drain regions, 501 and 503, are contained in a pillar of semiconductor material, and separated by a body region 507 including channel regions 505. As shown in the embodiments of FIGS. 5A–5E, the first source/drain region 501 is integrally connected to a buried sourceline 525. As one or ordinary skill in the art will understand upon reading this disclosure the buried sourceline 525 is be formed of semiconductor material which has the same doping type as the first source/drain region 501. In one embodiment, the sourceline 525 is formed of semiconductor material of the same doping as the first source/drain region 501, but is more heavily doped than the first source/drain region 501.

As shown in the embodiment of FIG. 5A, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In this embodiment, a single control gate 513 is shared by the pair of floating gates 509-1 and 509-2 on opposing sides of the trench 530. As one of ordinary skill in the art will understand upon reading this disclosure, the shared single control gate 513 can include an integrally formed control gate line. As shown in FIG. 5A, such an integrally formed control gate line 513 can be one of a plurality of control gate lines which are each independently formed in the trench, such as trench 530, below the top surface of the pillars 500-1 and 500-2 and between the pair of floating gates 509-1 and 509-2. In one embodiment, according to the teachings of the present invention, each floating gate, e.g. 509-1 and 509-2, includes a vertically oriented floating gate having a vertical length of less than 100 nanometers.

Figure 5B:
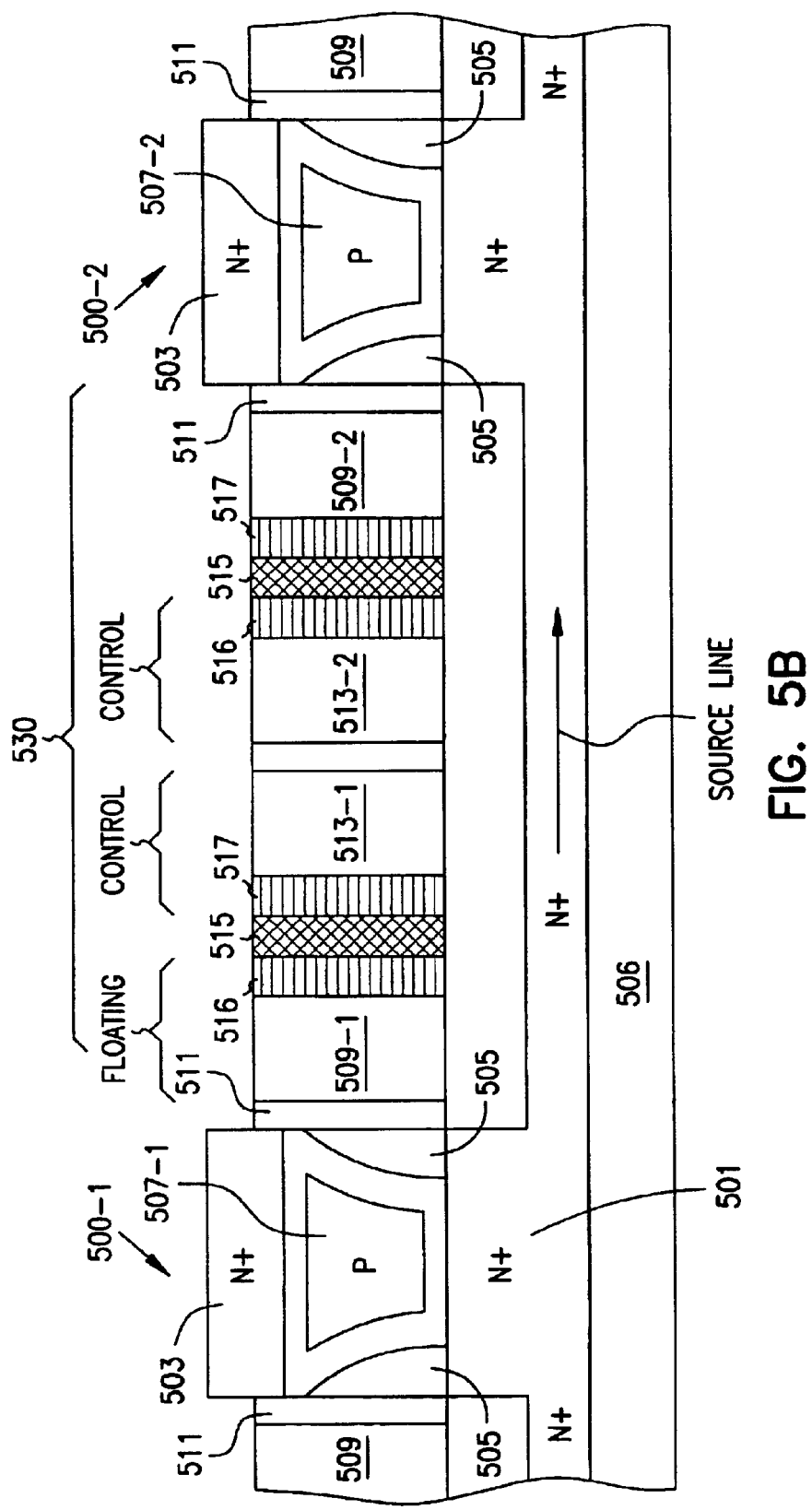

As shown in the embodiment of FIG. 5B, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5B, a plurality of control gate lines are again formed in trenches, e.g. trench 530, below the top surface of the pillars, 500-1 and 500-2, and between the pair of floating gates 509-1 and 509-2. However, in this embodiment, each trench, e.g. 530, houses a pair of control gate lines, shown as 513-1 and 513-2. Each one of the pair of control gate lines 513-1 and 513-2 adresses the floating gates, 509-1 and 509-2 respectively, on opposing sides of the trench 530. In this embodiment, the pair of control gate lines, or control gates 513-1 and 513-2 are separated by an insulator layer.

Figure 5C:
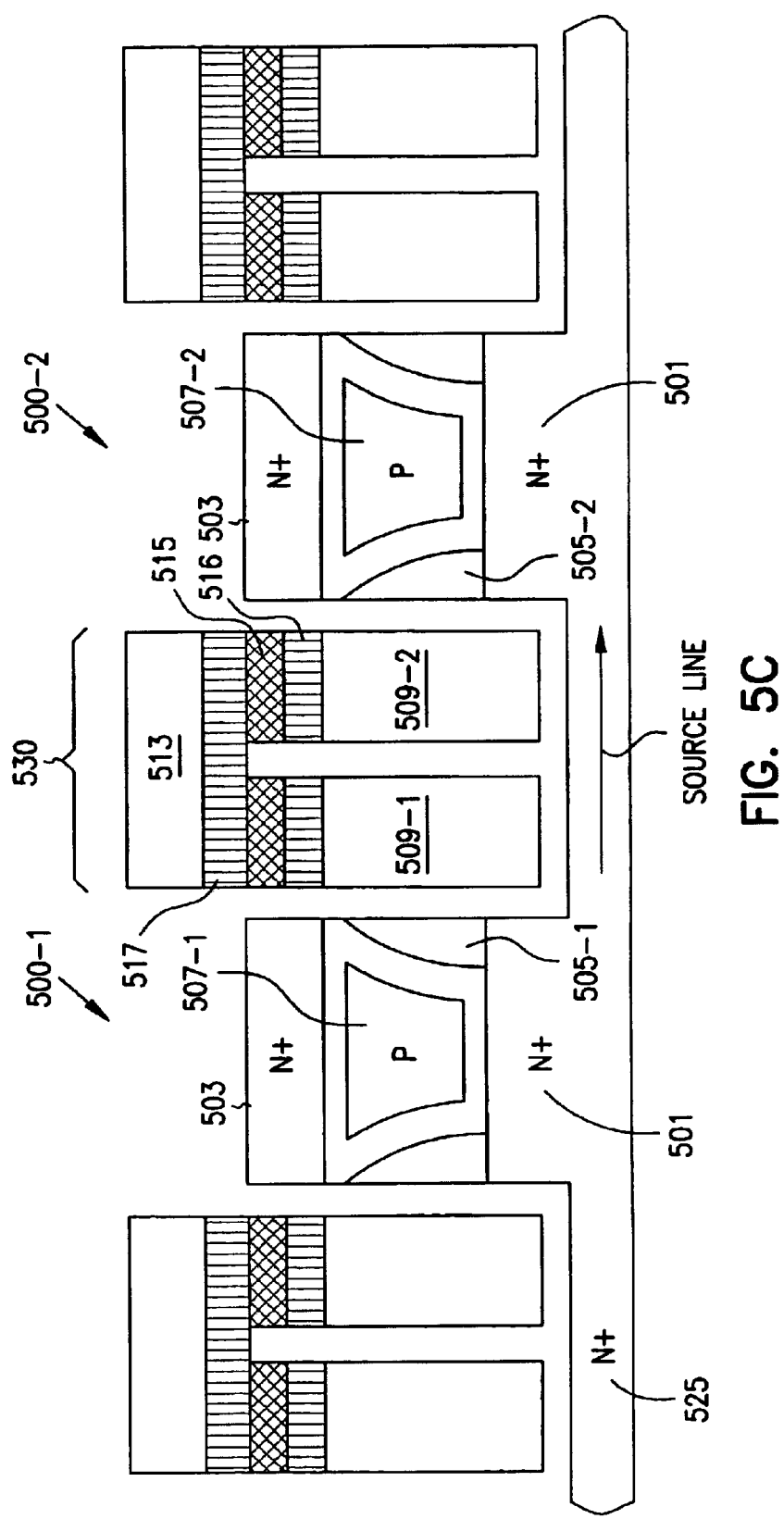

As shown in the embodiment of FIG. 5C, a pair of floating gates 509-1 and 509-2 are again formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5C, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. In the embodiment of FIG. 5C, each pair of floating gates, e.g. 509-1 and 509-2, in a given trench shares a single control gate line, or control gate 513.

Figure 5D:
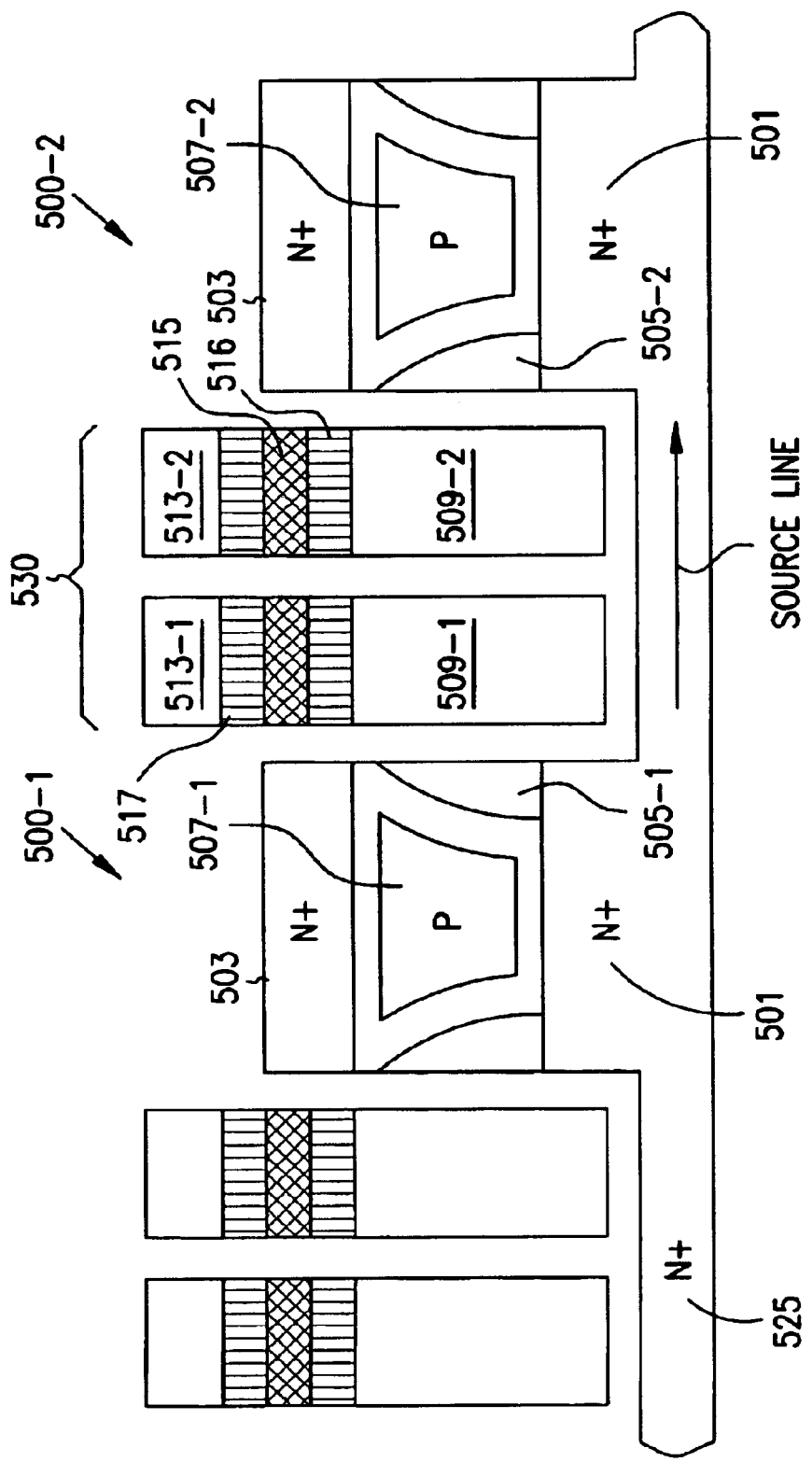

As shown in the embodiment of FIG. 5D, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5D, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. However, in the embodiment of FIG. 5D, each one of the pair of floating gates, e.g. 509-1 and 509-2, is addressed by an independent one of the plurality of control lines or control gates, shown in FIG. 5D as 513-1 and 513-2.

Figure 5E:
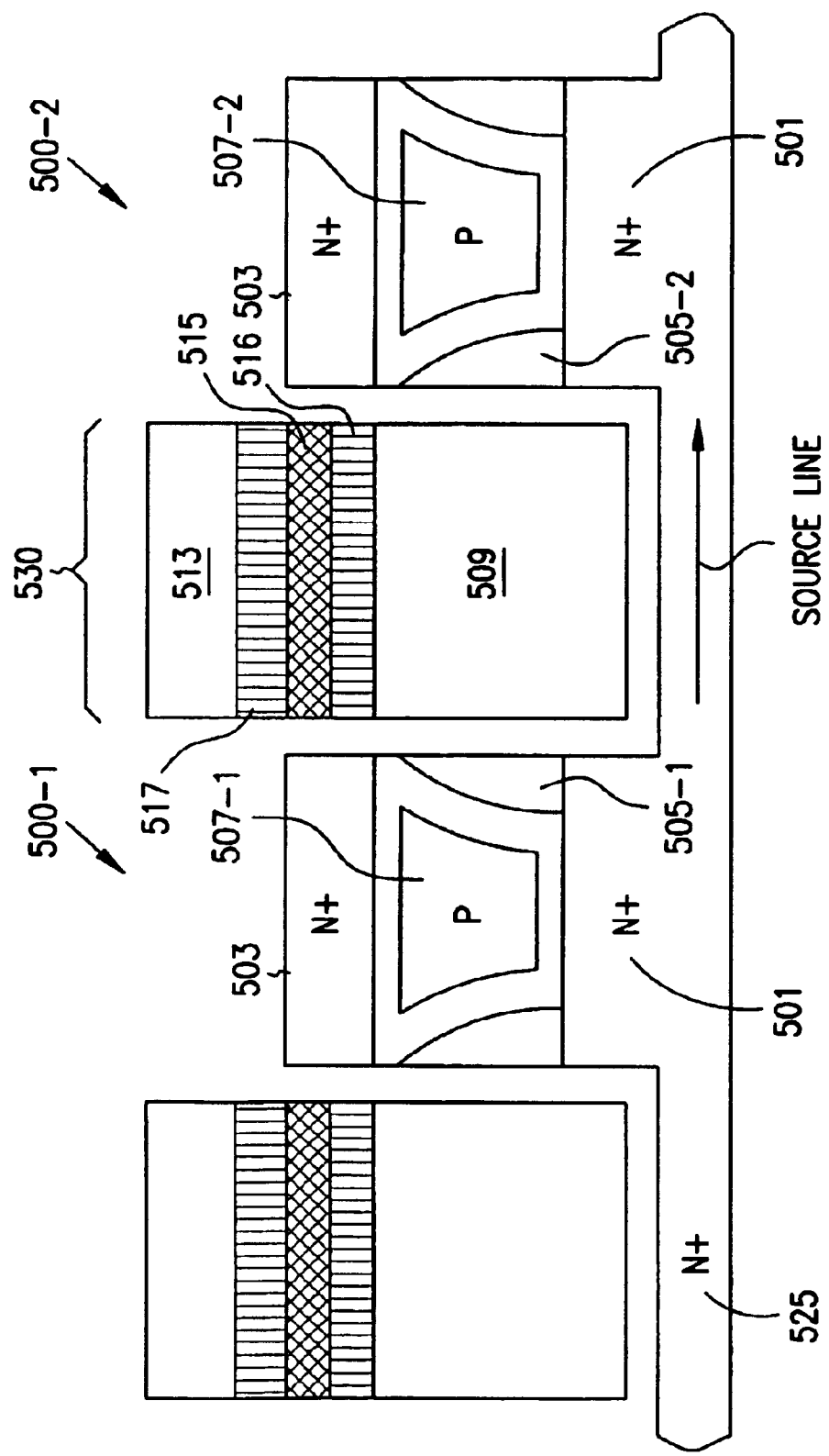

As shown in the embodiment of FIG. 5E, a single floating gate 509 is formed in each trench 530 between adjacent pillars which form memory cells 500-1 and 500-2. According to the teachings of the present invention, the single floating gate 509 can be either a vertically oriented floating gate 509 or a horizontally oriented floating gate 509 formed by conventional processing techniques, or can be a horizontally oriented floating gate 509 formed by a replacement gate technique. In one embodiment of the present invention, the floating gate 509 has a vertical length facing the body region 505 of less than 100 nm. In another embodiment, the floating gate 509 has a vertical length facing the body region 505 of less than 50 nm. In one embodiment, as shown in FIG. 5E, the floating gate 509 is shared, respectively, with the body regions 507-1 and 507-2, including channel regions 505-1 and 505-2, in adjacent pillars 500-1 and 500-2 located on opposing sides of the trench 530. And, as shown in FIG. 5E, the control gate includes a single horizontally oriented control gate line, or control gate 513 formed above the horizontally oriented floating gate 509.

As one of ordinary skill in the art will understand upon reading this disclosure, in each of the embodiments described above in connection with FIGS. 5A–5E the floating gates 509 are separated from the control gate lines, or control gates 513 with a low tunnel barrier intergate insulator in accordance with the descriptions given above in connection with FIG. 3. The modifications here are to use tunneling through the interpoly dielectric to realize flash memory devices. The vertical devices include an extra flexibility in that the capacitors, e.g. gate oxide and intergate insulator, are easily fabricated with different areas. This readily allows the use of very high dielectric constant inter-poly dielectric insulators with lower tunneling barriers.

Figure 6A:
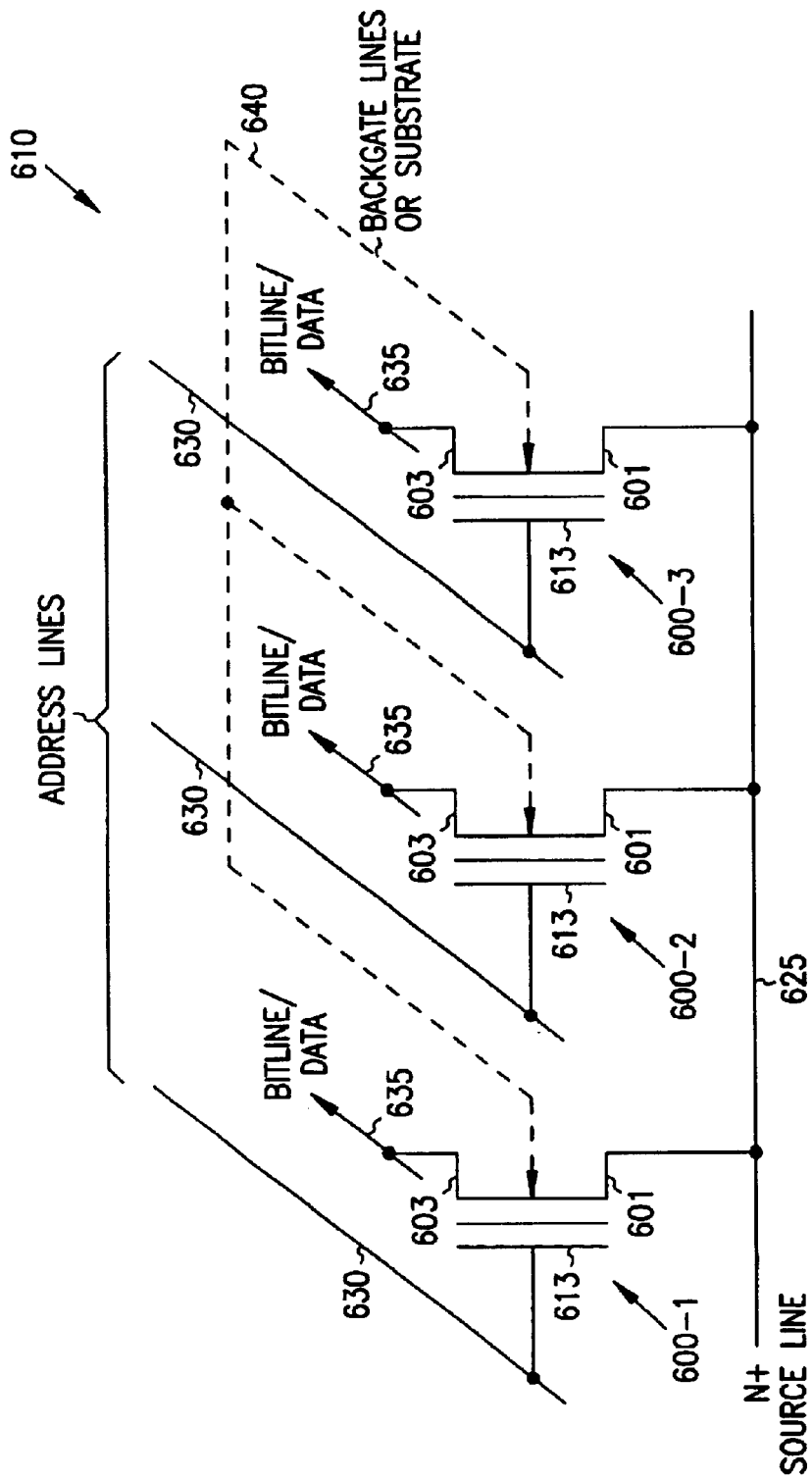
FIGS. 6A–6C illustrate a number of address coincidence schemes can be used together with the present invention.
Figure 6B:
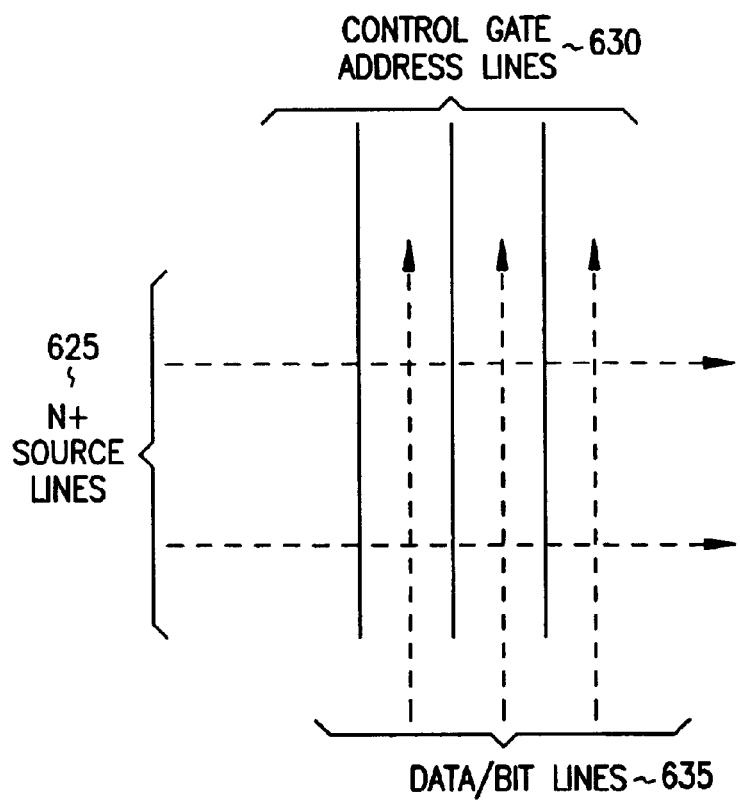
Figure 6C:
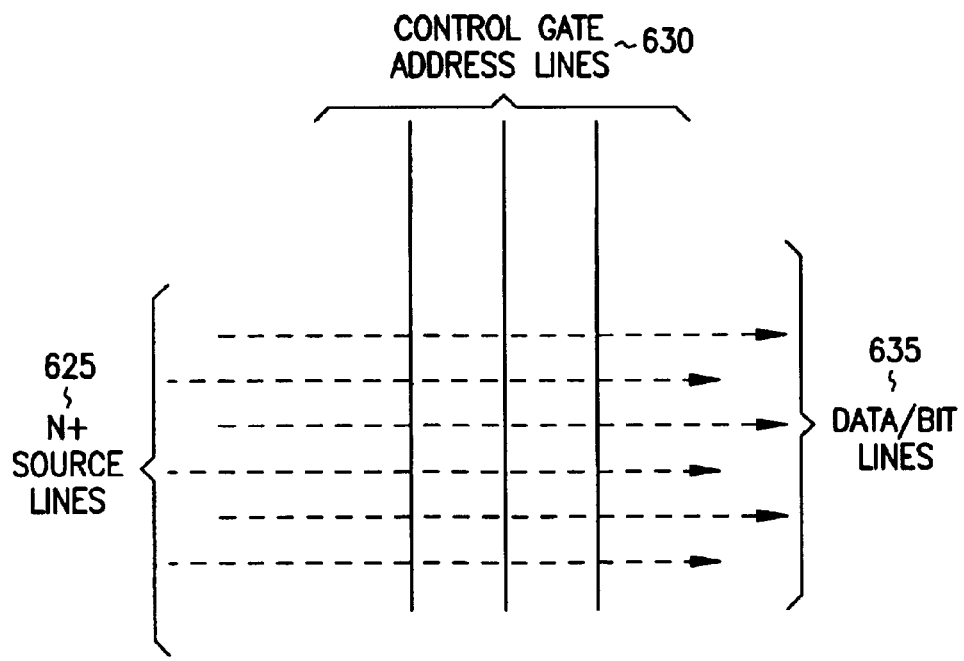
Figure 6D:
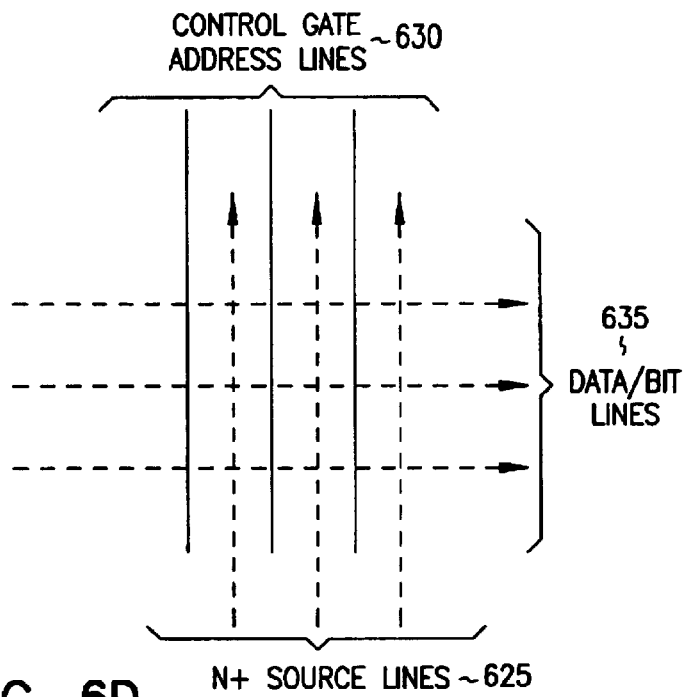

FIGS. 6A–6C illustrate that a number of address coincidence schemes can be used together with the present invention. FIG. 6A illustrates a NOR flash memory array 610 having a number of non-volatile memory cells 600-1, 600-2, 600-3, using a coincidence address array scheme. For purposes of illustration, FIG. 6A shows a sourceline 625 coupled to a first source/drain region 601 in each of the number of non-volatile memory cells 600-1, 600-2, 600-3. The sourceline is shown oriented in a first selected direction in the flash memory array 610. In FIG. 6A, a number of control gate lines 630 are shown oriented in a second selected direction in the flash memory array 610. As shown in FIG. 6A, the number of control gate lines 630 are coupled to, or integrally formed with the control gates 613 for the number of non-volatile memory cells 600-1, 600-2, 600-3. As shown in FIG. 6A, the second selected direction is orthogonal to the first selected direction. Finally, FIG. 6A shows a number of bitlines 635 oriented in a third selected direction in the flash memory array 610. As shown in FIG. 6A, the number of bitlines are coupled to the second source/drain regions in the number of non-volatile memory cells 600-1, 600-2, 600-3. In the embodiment shown in FIG. 6A the third selected direction is parallel to the second selected direction and the number of control gate lines 630 serve as address lines. Also, as shown in FIG. 6A, the flash memory array 610 includes a number of backgate or substrate/well bias address lines 640 coupled to the substrate.

Using FIG. 6A as a reference point, FIGS. 6B–6C illustrate of top view for three different coincidence address scheme layouts suitable for use with the present invention. First, FIG. 6B provides the top view layout of the coincidence address scheme described in connection with FIG. 6A. This is, FIG. 6B illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6B, the first selected direction and the third selected direction are parallel to one another and orthogonal to the second selected direction. In this embodiment, the number of control gate lines 630 serve as address lines. According to the teachings of the present invention the output lines, e.g. bitlines 635 must be perpendicular to the address lines, e.g. in this embodiment control gate lines 630.

FIG. 6C provides the top view layout of yet another coincidence address scheme according to the teachings of the present invention. This is, FIG. 6C illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6C, the first selected direction and the second selected direction are parallel to one another and orthogonal to the third selected direction. In this embodiment, the number of bitlines 635 serve as address lines. In an alternative embodiment, the sourcelines 625 can include a uniform ground plane as the same will be known and understood by one of ordinary skill in the art.

As will be apparent to one of ordinary skill in the art upon reading this disclosure, and as will be described in more detail below, write can still be achieved by hot electron injection and/or, according to the teachings of the present invention, tunneling from the control gate. According to the teachings of the present invention, block erase is accomplished by driving the control gates with a relatively large positive voltage and tunneling from the metal on top of the floating gate to the metal on the bottom of the control gate.

Figure 7A:
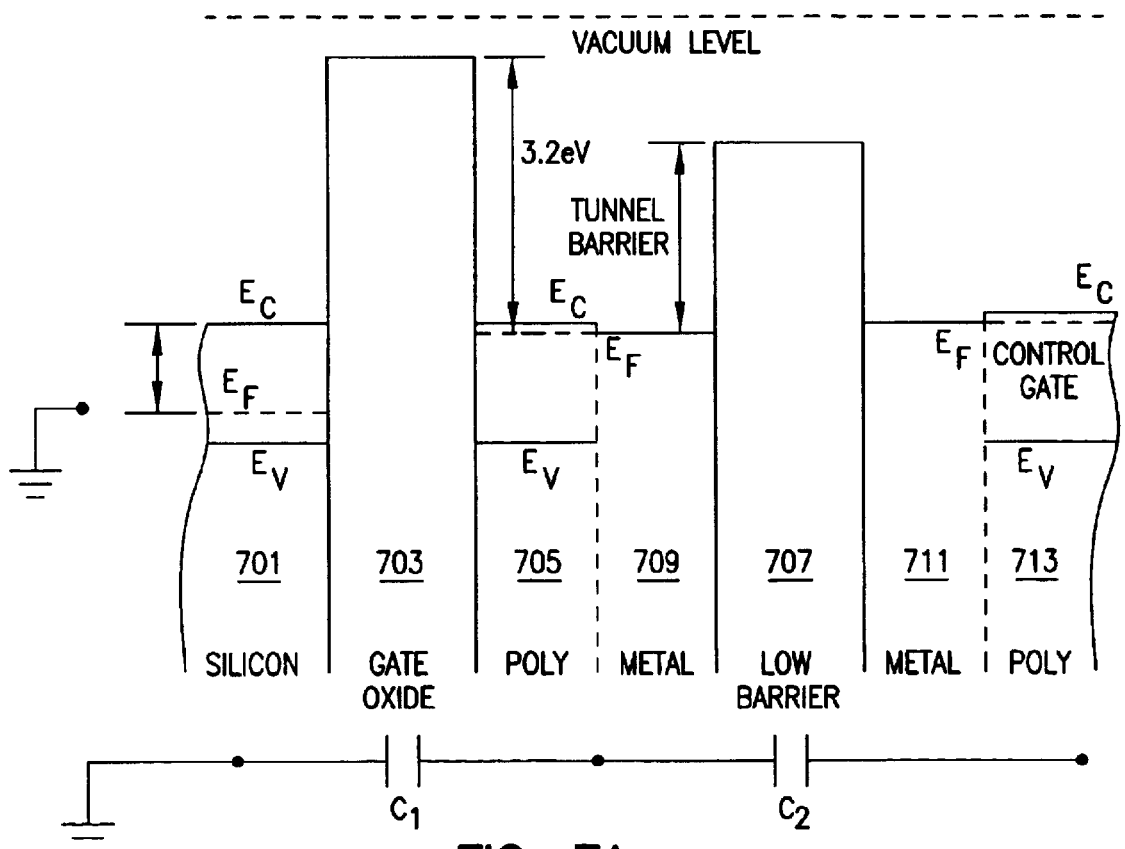
FIG. 7A is an energy band diagram illustrating the band structure at vacuum level with the low tunnel barrier inter-poly insulator according to the teachings of the present invention.

FIG. 7A is an energy band diagram illustrating the band structure at vacuum level with the low tunnel barrier interpoly insulator according to the teachings of the present invention. FIG. 7A is useful in illustrating the reduced tunnel barrier off of the floating gate to the control gate and for illustrating the respective capacitances of the structure according to the teachings of the present invention.

FIG. 7A shows the band structure of the silicon substrate, e.g. channel region 701, silicon dioxide gate insulator, e.g. gate oxide 703, polysilicon floating gate 705, the low tunnel barrier interpoly dielectric 707, between metal plates 709 and 711, and then the polysilicon control gate 713, according to the teachings of the present invention.

The design considerations involved are determined by the dielectric constant, thickness and tunneling barrier height of the interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

Figure 7B:
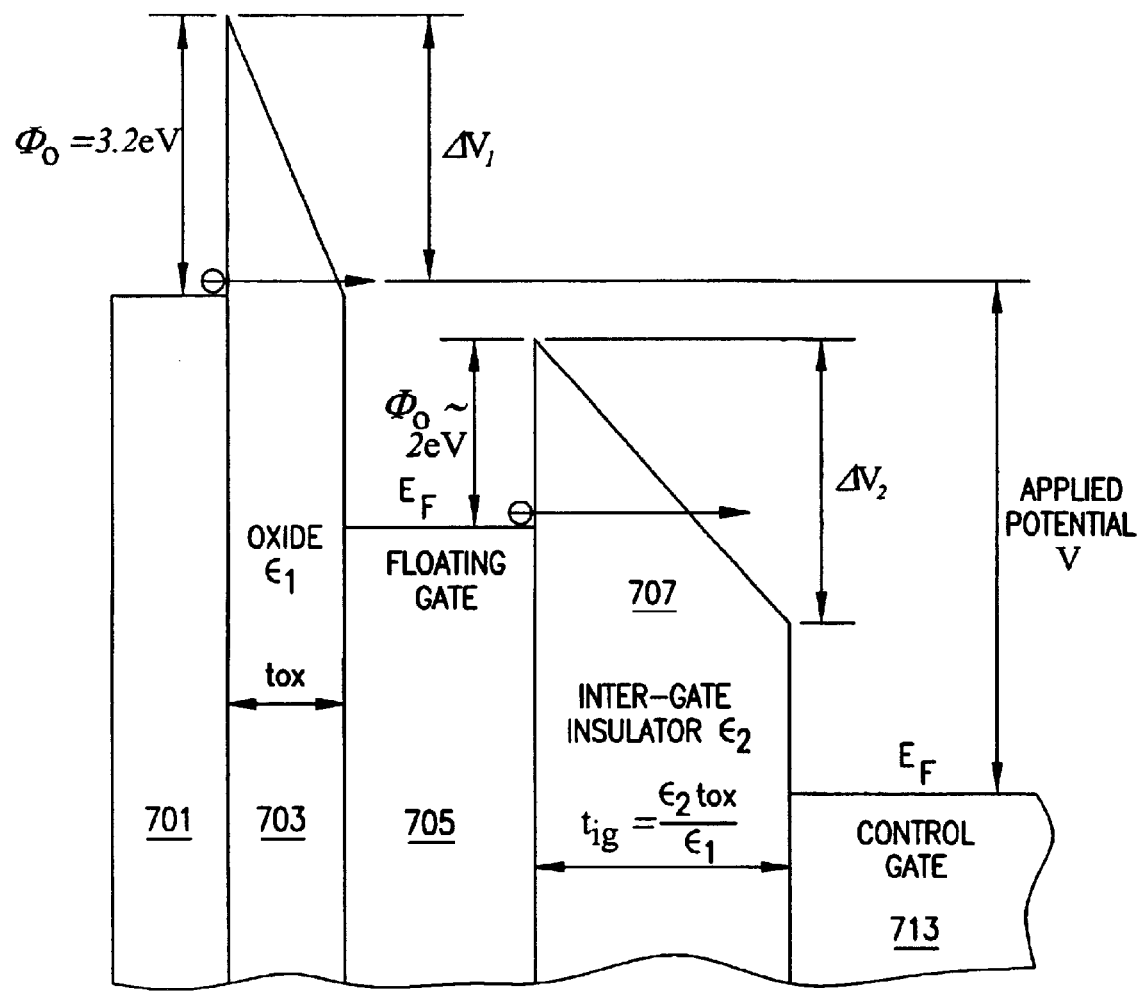
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate to the control gate and for illustrating the respective capacitances of the structure according to the teachings of the present invention.

As shown in FIG. 7B, the electric field is determined by the total voltage difference across the structure, the ratio of the capacitances (see FIG. 7A), and the thickness of the interpoly dielectric 707. The voltage across the interpoly dielectric 707 will be, $\Delta V2 = V\, C1/(C1+C2)$, where V is the total applied voltage. The capacitances, C, of the structures depends on the dielectric constant, $\in_r$, or the permittivity of free space, $e_o$, and the thickness of the insulating layers, t, and area, A, such that $C=\in_r\in_o A/t$, Farads/cm², where $\in_r$ represents the low frequency dielectric constant. The electric field across the interpoly dielectric insulator 707, having capacitance, C2, will then be $E2=\Delta V2/t2$, where t2 is the thickness of this layer.

The tunneling current in erasing charge from the floating gate 705 by tunneling to the control gate 713 will then be as shown in FIG. 7B given by an equation of the form:

$$J = B\, \exp(-Eo/E)$$

$$J = \frac{q^2 E^2}{4\pi h \Phi} e^{-E_O/E} \qquad E_O = \frac{8\pi}{3} \frac{\sqrt{2mq^*}\, \Phi^{\frac{3}{2}}}{h}$$

where E is the electric field across the interpoly dielectric insulator 707 and Eo depends on the barrier height. Aluminum oxide has a current density of 1 A/cm² at a field of about $E=1V/20$ $A=5\times10^{+6}$ V/cm. Silicon oxide transistor gate insulators have a current density of 1 A/cm² at a field of about $E=2.3V/23$ $A=1\times10^{+7}$ V/cm.

The lower electric field in the aluminum oxide interpoly insulator 707 for the same current density reflects the lower tunneling barrier of less than 2 eV, shown in FIG. 7B, as opposed to the 3.2 eV tunneling barrier of silicon oxide 703, also illustrated in FIG. 7B.

Figure 7C:
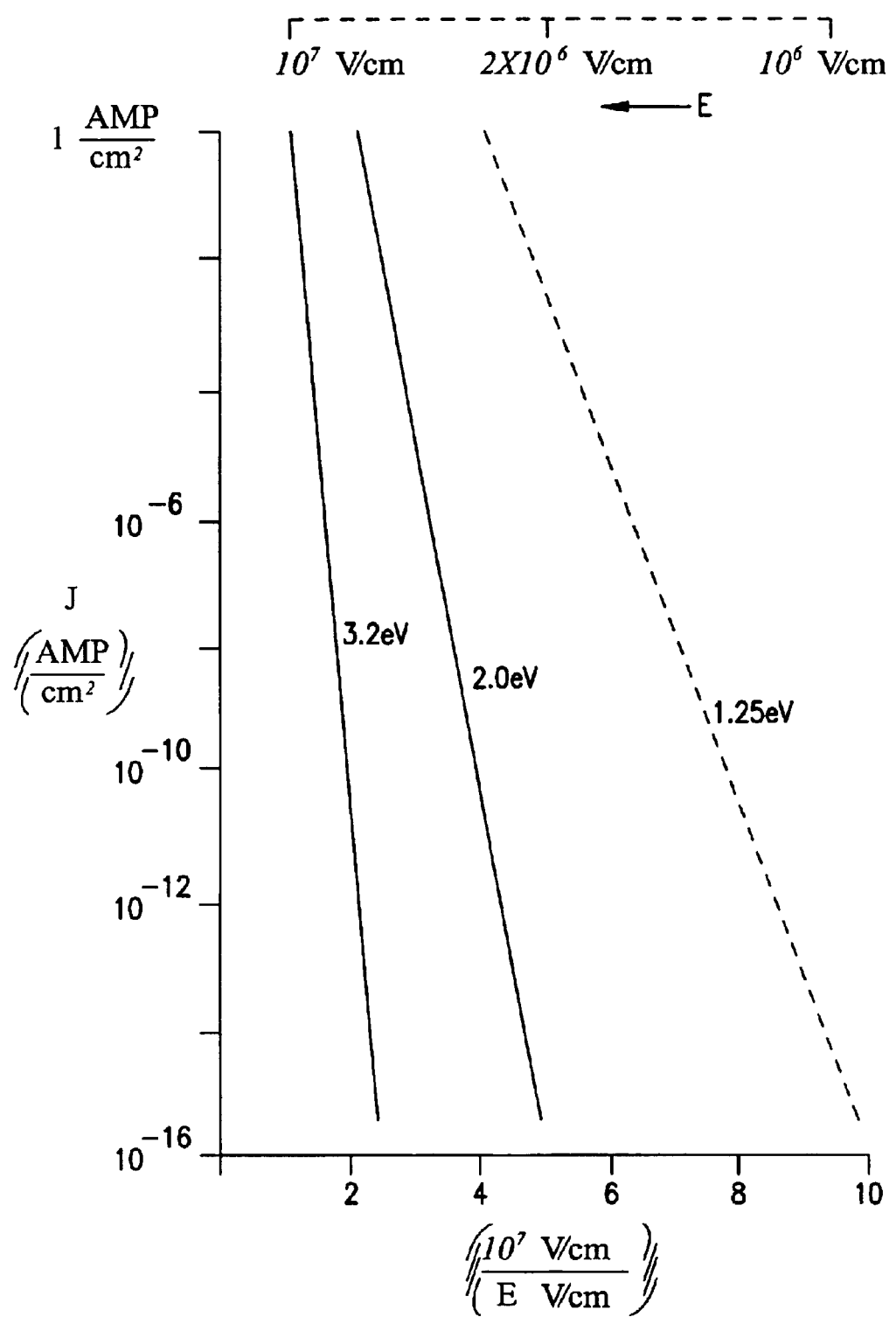
FIG. 7C is a graph plotting tunneling currents versus the applied electric fields (reciprocal applied electric field shown) for an number of barrier heights.

FIG. 7C is a graph plotting tunneling currents versus the applied electric fields (reciprocal applied electric field shown) for an number of barrier heights. FIG. 7C illustrates the dependence of the tunneling currents on electric field (reciprocal applied electric field) and barrier height. The fraction of voltage across the interpoly or intergate insulator, $\Delta V2$, can be increased by making the area of the intergate capacitor, C2, (e.g. intergate insulator 707) smaller than the area of the transistor gate capacitor, C1 (e.g. gate oxide 703). This would be required with high dielectric constant intergate dielectric insulators 707 and is easily realized with the vertical floating gate structures described above in connection with FIGS. 3, and 5A–5E.

Methods of Formation

Several examples are outlined below in order to illustrate how a diversity of such metal oxide tunnel barriers can be formed, according to the teachings of the present invention. Processing details and precise pathways taken which are not expressly set forth below will be obvious to one of ordinary skill in the art upon reading this disclosure. Firstly, although not included in the details below, it is important also to take into account the following processing factors in connection with the present invention:

(i) The poly-Si layer is to be formed with emphasis on obtaining a surface that is very smooth and morphologically stable at subsequent device processing temperatures which will exceed that used to grow Metal oxide.

(ii) The native $SiO_x$ oxide on the poly-Si surface must be removed (e.g., by sputter cleaning in an inert gas plasma in situ) just prior to depositing the metal film. The electrical characteristics of the resultant Poly-Si/Metal/Metal oxide/Metal/Poly-Si structure will be better defined and reproducible than that of a Poly-Si/Native $SiO_x$/Metal/Metal oxide/Poly-Si structure.

(iii) The oxide growth rate and limiting thickness will increase with oxidation temperature and oxygen pressure. The oxidation kinetics of a metal may, in some cases, depend on the crystallographic orientations of the very small grains of metal which comprise the metal film. If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. For example, fcc metals prefer to form {111} surface plans. Metal orientation effects, if present, would be larger when only a limited fraction of the metal will be oxidized and unimportant when all or most of the metal is oxidized.

(iv) Modifications in the structure shown in FIG. 2 may be introduced in order to compensate for certain properties in some metal/oxide/metal layers. Such changes are reasonable since a wide range of metals, alloys and oxides with quite different physical and chemical properties can be used to form these tunnel junctions.

EXAMPLE I

Formation of PbO Tunnel Barriers

This oxide barrier has been studied in detail using Pb/PbO/Pb structures. The oxide itself can be grown very controllably on deposited lead films using either thermal oxidation or rf sputter etching in an oxygen plasma. It will be seen that there are a number of possible variations on this structure. Starting with a clean poly-Si substrate, one processing sequence using thermal oxidation involves:

(i) Depositing a clean lead film on the poly-Si floating gate at ~25 to 75 C. in a clean vacuum system having a base pressure of ~$10^{-8}$ Torr or lower. The Pb film will be very thin with a thickness within 1 or 2 A of its target value.

(ii) Lead and other metal films can be deposited by various means including physical sputtering and/or from a Knudsen evaporation cell. The sputtering process also offers the ability to produce smoother films by increasing the re-sputtering-to-deposition ratio since re-sputtering preferentially reduces geometric high points of the film.

(iii) Using a "low temperature oxidation process" to grow an oxide film of self-limited thickness. In this case, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 A, as determined via in situ ellipsometric or ex situ measurements of Josephson tunneling currents. This control is demonstrated by the very limited statistical scatter of the current PbO thickness data shown in the insert of FIG. 3. This remarkable degree of control over tunnel current is due to the excellent control over PbO thickness that can be achieved by "low temperature oxidation." For example, increasing the oxidation time from 100 to 1,000 minutes at an oxygen pressure of 750 Torr at 25 C. only raises the PbO thickness by 3 A (e.g., from ~21 to 24 A. Accordingly, controlling the oxidation time to within 1 out of a nominal 100 minute total oxidation time provides a thickness that is within 0.1 A of 21 A. The PbO has a highly stoichiometric composition throughout its thickness, as evidenced from ellipsometry and the fact that the tunnel barrier heights are identical for Pb/PbO/Pb structures.

(iv) Re-evacuate the system and deposit the top lead electrode. This produces a tunnel structure having virtually identical tunnel barriers at both Pb/O interfaces.

(v) The temperature used to subsequently deposit the Poly-Si control gate must be held below the melting temperature (327 C.) of lead. The PbO itself is stable (up to ~500 C. or higher) and thus introduces no temperature constraint on subsequent processes. One may optionally oxidize the lead film to completion, thereby circumventing the low melting temperature of metallic lead. In this case, one would form a Poly-Si/PbO/Poly-Si tunnel structure having an altered tunnel barrier for charge injection. Yet another variation out of several would involve: oxidizing the lead film to completion; replacing the top lead electrode with a higher melting metal such as Al; and, then adding the poly-Si control layer. This junction would have asymmetrical tunneling behavior due to the difference in barrier heights between the Pb/PbO and PbO/Al electrodes.

EXAMPLE II

Formation of $Al_2O_3$ Tunnel Barriers

A number of studies have dealt with electron tunneling in $Al/Al_2O_3/Al$ structures where the oxide was grown by "low temperature oxidation" in either molecular or plasma oxygen. Before sketching out a processing sequence for these tunnel barriers, note:

(i) Capacitance and tunnel measurements indicate that the $Al_2O_3$ thickness increases with the log (oxidation time), similar to that found for PbO/Pb as well as a great many other oxide/metal systems.

(ii) Tunnel currents are asymmetrical in this system with somewhat larger currents flowing when electrons are injected from $Al/Al_2O_3$ interface developed during oxide growth. This asymmetry is due to a minor change in composition of the growing oxide: there is a small concentration of excess metal in the $Al_2O_3$, the concentration of which diminishes as the oxide is grown thicker. The excess $Al^{+3}$ ions produce a space charge that lowers the tunnel barrier at the inner interface. The oxide composition at the outer $Al_2O_3/Al$ contact is much more stoichiometric and thus has a higher tunnel barrier. In situ ellipsometer measurements on the thermal oxidation of Al films deposited and oxidized in situ support this model. In spite of this minor complication, $Al/Al_2O_3/Al$ tunnel barriers can be formed that will produce predictable and highly controllable tunnel currents that can be ejected from either electrode. The magnitude of the currents are still primarily dominated by $Al_2O_3$ thickness which can be controlled via the oxidation parametrics.

With this background, we can proceed to outline one process path out of several that can be used to form $Al_2O_3$ tunnel barriers. Here the aluminum is thermally oxidized although one could use other techniques such as plasma oxidation or rf sputtering in an oxygen plasma. For the sake of brevity, some details noted above will not be repeated. The formation of the $Al/Al_2O_3/Al$ structures will be seen to be simpler than that described for the Pb/PbO/Pb junctions owing to the much higher melting point of aluminum, relative to lead.

(i) Sputter deposit aluminum on poly-Si at a temperature of ~25 to 150 C. Due to thermodynamic forces, the microcrystallites of the f.c.c. aluminum will have a strong and desirable (111) preferred orientation.

(ii) Oxidize the aluminum in situ in molecular oxygen using temperatures, pressure and time to obtain the desired $Al_2O_3$ thickness. As with PbO, the thickness increases with log (time) and can be controlled via time at a fixed oxygen pressure and temperature to within 0.10 Angstroms, when averaged over a large number of aluminum grains that are present under the counter-electrode. One can readily change the $Al_2O_3$ thickness from ~15 to 35 A by using appropriate oxidation parametrics. The oxide will be amorphous and remain so until temperatures in excess of 400 C. are reached. The initiation of recrystallization and grain growth can be suppressed, if desired, via the addition of small amounts of glass forming elements (e.g., Si) without altering the growth kinetics or barrier heights significantly.

(iii) Re-evacuate the system and deposit a second layer of aluminum.

(iv) Deposit the Poly-Si control gate layer using conventional processes.

EXAMPLE III

Formation of Single- and Multi-Layer Transition Metal Oxide Tunnel Barriers.

Single layers of $Ta_2O_5$, $TiO_2$, $ZrO_2$, $Nb_2O_5$ and similar transition metal oxides can be formed by "low temperature oxidation" of numerous Transition Metal (e.g., TM oxides) films in molecular and plasma oxygen and also by rf sputtering in an oxygen plasma. The thermal oxidation kinetics of these metals have been studied for decades. In essence, such metals oxidize via logarithmic kinetics to reach thicknesses of a few to several tens of angstroms in the range of 100 to 300 C. Excellent oxide barriers for Josephson tunnel devices can be formed by rf sputter etching these metals in an oxygen plasma. Such "low temperature oxidation" approaches differ considerably from MOCVD processes used to produce these TM oxides. MOCVD films require high temperature oxidation treatments to remove carbon impurities, improve oxide stoichiometry and produce recrystallization. Such high temperature treatments also cause unwanted interactions between the oxide and the underlying silicon and thus have necessitated the introduction of interfacial barrier layers.

An approach was developed utilizing "low temperature oxidation" to form duplex layers of TM oxides. Unlike MOCVD films, the oxides are very pure and stoichiometric as formed. They do require at least a brief high temperature (est. 700 to 800 C. but may be lower) treatment to transform their microstructures from amorphous to crystalline and thus increase their dielectric constants to the desired values (>20 or so). Unlike MOCVD oxides, this treatment can be carried out in an inert gas atmosphere, thus lessening the possibility of inadvertently oxidizing the poly-Si floating gate. While this earlier disclosure was directed at developing methods and procedures for producing high dielectric constant films for storage cells for DRAMs, the same teachings can be applied to producing thinner metal oxide tunnel films for the flash memory devices described in this disclosure. The dielectric constants of these TM oxides are substantially greater (>25 to 30 or more) than those of PbO and $Al_2O_3$. Duplex layers of these high dielectric constant oxide films are easily fabricated with simple tools and also provide improvement in device yields and reliability. Each oxide layer will contain some level of defects but the probability that such defects will overlap is exceedingly small. Effects of such duplex layers were first reported by one J. M. Eldridge of the present authors and are well known to practitioners of the art. It is worth mentioning that highly reproducible TM oxide tunnel barriers can be grown by rf sputtering in an oxygen ambient. Control over oxide thickness and other properties in these studies were all the more remarkable in view of the fact that the oxides were typically grown on thick (e.g., 5,000 A) metals such as Nb and Ta. In such metal-oxide systems, a range of layers and suboxides can also form, each having their own properties. In the present disclosure, control over the properties of the various TM oxides will be even better since we employ very limited (perhaps 10 to 100 A or so) thicknesses of metal and thereby preclude the formation of significant quantities of unwanted, less controllable sub-oxide films. Thermodynamic forces will drive the oxide compositions to their most stable, fully oxidized state, e.g., $Nb_2O_5$, $Ta_2O_5$, etc. As noted above, it will still be necessary to crystallize these duplex oxide layers. Such treatments can be done by RTP and will be shorter than those used on MOCVD and sputter-deposited oxides since the stoichiometry and purity of the "low temperature oxides" need not be adjusted at high temperature.

Fairly detailed descriptions for producing thicker duplex layers of TM oxides have been given in the copending application by J. M. Eldridge, entitled "Thin Dielectric Films for DRAM Storage Capacitors," patent application Ser. No. 09/651,380 filed Aug. 29, 2000, so there is no need to repeat them here. Although perhaps obvious to those skilled in the art, one can sketch out a few useful fabrication guides:

(i) Thinner TM layers will be used in this invention relative to those used to form DRAMs. Unlike DRAMs where leakage must be eliminated, the duplex oxides used here must be thin enough to carry very controlled levels of current flow when subjected to reasonable applied fields and times.

(ii) The TM and their oxides are highly refractory and etchable (e.g., by RIE). Hence they are quite compatible with poly-Si control gate processes and other subsequent steps.

(iii) TM silicide formation will not occur during the oxidation step. It could take place at a significant rate at the temperatures used to deposit the poly-Si control gate. If so, several solutions can be applied including:

(i) Insert certain metals at the TM/poly-Si boundaries that will prevent inter-diffusion of the TM and the poly-Si.

(ii) Completely oxide the TMs. The electrical characteristics of the resulting poly-Si/TM oxide 1/TM oxide 2/poly-Si structure will be different in the absence of having TM at the oxide/metal interfaces.

EXAMPLE IV

Formation of Alternate Metal Compound Tunnel Barriers.

Although no applications may be immediately obvious, it is conceivable that one might want to form a stack of oxide films having quite different properties, for example, a stack comprised of a high dielectric constant (k) oxide/a low k oxide/a high k oxide. "Low temperature oxidation" can be used to form numerous variations of such structures. While most of this disclosure deals with the formation and use of stacks of oxide dielectrics, it is also possible to use "low temperature oxidation" to form other thin film dielectrics such as nitrides, oxynitrides, etc. that could provide additional functions such as being altered by monochromatic light, etc. These will not be discussed further here.

EXAMPLE V

Formation of Perovskite Oxide Tunnel Barriers.

Some results have been obtained which demonstrate that at least a limited range of high temperature, superconducting oxide films can be made by thermally oxidizing Y—Ba—Cu alloy films. The present inventors have also disclosed how to employ "low temperature oxidation" and short thermal treatments in an inert ambient at 700 C. in order to form a range of perovskite oxide films from parent alloy films. The dielectric constants of crystallized, perovskite oxides can be very large, with values in the 100 to 1000 or more range. The basic process is more complicated than that needed to oxidize layered films of transition metals. (See Example III.) The TM layers would typically be pure metals although they could be alloyed. The TMs are similar metallurgically as are their oxides. In contrast, the parent alloy films that can be converted to a perovskite oxide are typically comprised of metals having widely different chemical reactivities with oxygen and other common gasses. In the Y—Ba—Cu system referenced above, Y and Ba are among the most reactive of metals while the reactivity of Cu approaches (albeit distantly) those of other noble metals. If the alloy is to be completely oxidized, then thin film barriers such as Pd, Pt, etc. or their conductive oxides must be added between the Si and the parent metal film to serve as: electrical contact layers; diffusion barriers; and, oxidation stops. In such a case, the Schottky barrier heights of various TM oxides and perovskite oxides in contact with various metals will help in the design of the tunnel device. In the more likely event that the perovskite parent alloy film will be only partially converted to oxide and then covered with a second layer of the parent alloy (recall the structure of FIG. 2), then the barrier heights will represent that developed during oxide growth at the parent perovskite alloy/perovskite oxide interface. Obviously, such barrier heights cannot be predicted ab initio for such a wide class of materials but will have to be developed as the need arises. This information will have to be developed on a system-by-system basis.

Methods of Operation

Write Operation

Write can be achieved by the normal channel hot electron injection and gate current through the silicon oxide to the floating gate. This is done by selecting a particular column by applying a high control gate voltage and applying relatively large drain voltage as is done with conventional ETOX flash memory devices. However, according to the teachings of the present invention, write can also be accomplished by applying a positive voltage to the substrate or well select line and a large negative voltage to the control gates, electrons will tunnel from the control gate to the floating gate. The low tunnel barrier will provide an easy write operation and the selection of the substrate or well bias will provide selectivity and address only one device.

Erase Operation

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

Read Operation

Read is accomplished as in conventional ETOX flash memory devices. A column line is addressed by applying a positive control gate voltage and sensing the current along the data bit or drain row address line.

System Level

Figure 8:
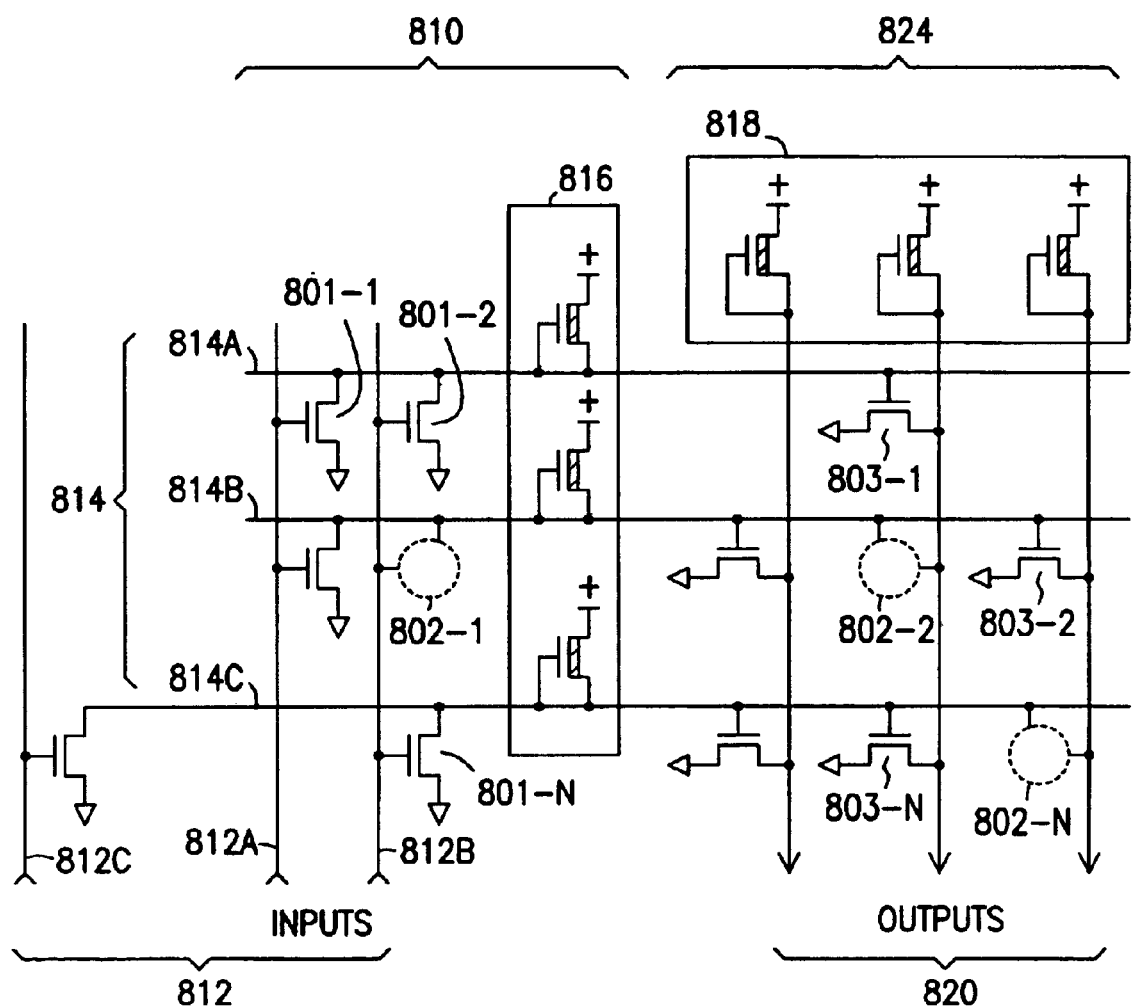
FIG. 8 is a schematic diagram illustrating a conventional NOR-NOR programmable logic array.

FIG. 8 shows a conventional NOR-NOR logic array 800 which is programmable at the gate mask level by either fabricating a thin oxide gate transistor, e.g. logic cells 801-1, 801-2, . . . , 801-N and 803-1, 803-2, . . . , 803-N, at the intersection of lines in the array or not fabricating a thin oxide gate transistor, e.g. missing thin oxide transistors, 802-1, 802-2, . . . , 802-N, at such an intersection. As one of ordinary skill in the art will understand upon reading this disclosure, the same technique is conventionally used to form other types of logic arrays not shown. As shown in FIG. 8, a number of depletion mode NMOS transistors, 816 and 818 respectively, are used as load devices.

The conventional logic array shown in FIG. 8 includes a first logic plane 810 which receives a number of input signals at input lines 812. In this example, no inverters are provided for generating complements of the input signals. However, first logic plane 810 can include inverters to produce the complementary signals when needed in a specific application.

First logic plane 810 includes a number of thin oxide gate transistors, e.g. transistors 801-1, 801-2, . . . , 801-N. The thin oxide gate transistors, 801-1, 801-2, . . . , 801-N, are located at the intersection of input lines 812, and interconnect lines 814. In the conventional PLA of FIG. 8, this selective fabrication of thin oxide gate transistor, e.g. transistors 801-1, 801-2, . . . , 801-N, is referred to as programming since the logical function implemented by the programmable logic array is entered into the array by the selective arrangement of the thin oxide gate transistors, or logic cells, 801-1, 801-2, . . . , 801-N, at the intersections of input lines 812, and interconnect lines 814 in the array.

In this embodiment, each of the interconnect lines 814 acts as a NOR gate for the input lines 812 that are connected to the interconnect lines 814 through the thin oxide gate transistors, 801-1, 801-2, . . . , 801-N, of the array. For example, interconnection line 814A acts as a NOR gate for the signals on input lines 812A and 812B. That is, interconnect line 814A is maintained at a high potential unless one or more of the thin oxide gate transistors, 801-1, 801-2, . . . , 801-N, that are coupled to interconnect line 814A are turned on by a high logic level signal on one of the input lines 812. When a control gate address is activated, through input lines 812, each thin oxide gate transistor, e.g. transistors 801-1, 801-2, . . . , 801-N, conducts which performs the NOR positive logic circuit function, an inversion of the OR circuit function results from inversion of data onto the interconnect lines 814 through the thin oxide gate transistors, 801-1, 801-2, . . . , 801-N, of the array.

As shown in FIG. 8, a second logic plane 824 is provided which includes a number of thin oxide gate transistor, e.g. transistors 803-1, 803-2, . . . , 803-N. The thin oxide gate transistors, 803-1, 803-2, . . . , 803-N, are located at the intersection of interconnect lines 814, and output lines 820. Here again, the logical function of the second logic plane 824 is implemented by the selective arrangement of the thin oxide gate transistors, 803-1, 803-2, . . . , 803-N, at the intersections of interconnect lines 814, and output lines 820 in the second logic plane 824. The second logic plane 824 is also configured such that the output lines 820 comprise a logical NOR function of the signals from the interconnection lines 814 that are coupled to particular output lines 820 through the thin oxide gate transistors, 803-1, 803-2, . . . , 803-N, of the second logic plane 824. Thus, in FIG. 8, the incoming signals on each line are used to drive the gates of transistors in the NOR logic array as the same is known by one of ordinary skill in the art and will be understood by reading this disclosure.

Figure 9:
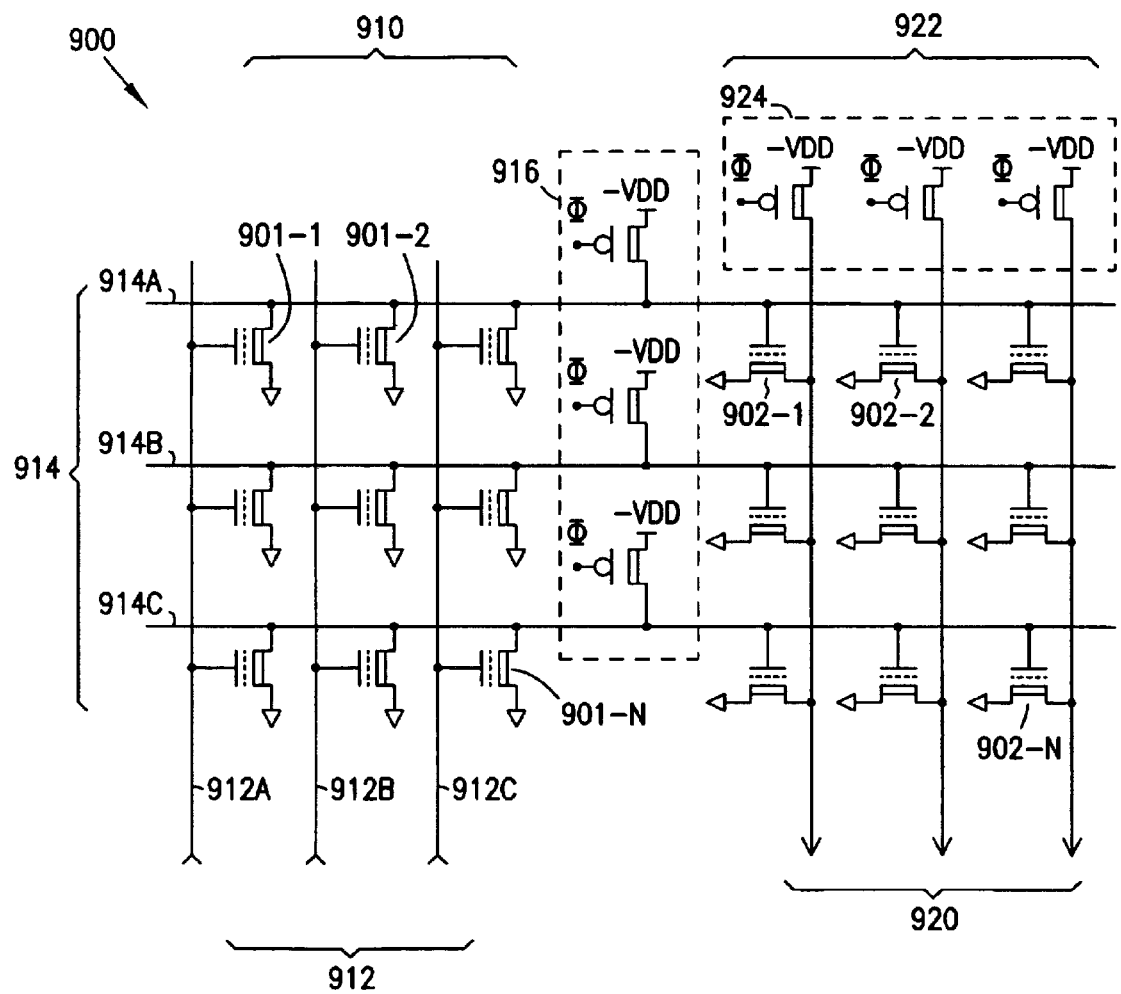
FIG. 9 is a schematic diagram illustrating generally an architecture of one embodiment of a novel in-service programmable logic array (PLA) with floating gate transistors, or logic cells, according to the teachings of the present invention.

FIG. 9 illustrates an embodiment of a novel in-service programmable logic array (PLA) formed according to the teachings of the present invention. In FIG. 9, PLA 900 implements an illustrative logical function using a two level logic approach. Specifically, PLA 900 includes first and second logic planes 910 and 922. In this example, the logic function is implemented using NOR-NOR logic. As shown in FIG. 9, first and second logic planes 910 and 922 each include an array of, logic cells, non-volatile memory cells, or floating gate driver transistors, 901-1, 901-2, . . . , 901-N, and 902-1, 902-2, . . . , 902-N respectively, formed according to the teachings of the present invention. The floating gate driver transistors, 901-1, 901-2, . . . , 901-N, and 902-1, 902-2, . . . , 902-N, have their first source/drain regions coupled to source lines or a conductive source plane, as shown and described in more detail in connection with FIGS. 2 and 7C. These floating gate driver transistors, 901-1, 901-2, . . . , 901-N, and 902-1, 902-2, . . . , 902-N are configured to implement the logical function of FPLA 900. The floating gate driver transistors, 901-1, 901-2, . . . , 901-N, and 902-1, 902-2, . . . , 902-N are shown as n-channel floating gate transistors. However, the invention is not so limited. Also, as shown in FIG. 9, a number of p-channel metal oxide semiconductor (PMOS) transistors are provided as load device transistors, 916 and 924 respectively, having their source regions coupled to a voltage potential (VDD). These load device transistors, 916 and 924 respectively, operate in complement to the floating gate driver transistors, 901-1, 901-2, . . . , 901-N, and 902-1, 902-2, . . . , 902-N to form load inverters.

It is noted that the configuration of FIG. 9 is provided by way of example and not by way of limitation. Specifically, the teachings of the present application are not limited to programmable logic arrays in the NOR-NOR approach. Further, the teachings of the present application are not limited to the specific logical function shown in FIG. 9. Other logical functions can be implemented in a programmable logic array, with the floating gate driver transistors, 901-1, 901-2, . . . , 901-N, and 902-1, 902-2, . . . , 902-N and load device transistors, 916 and 924 respectively, of the present invention, using any one of the various two level logic approaches.

First logic plane 910 receives a number of input signals at input lines 912. In this example, no inverters are provided for generating complements of the input signals. However, first logic plane 910 can include inverters to produce the complementary signals when needed in a specific application.

First logic plane 910 includes a number of floating gate driver transistors, 901-1, 901-2, . . . , 901-N, that form an array such as an array of non-volatile memory cells, or flash memory cells. The floating gate driver transistors, 901-1, 901-2, . . . , 901-N, are located at the intersection of input lines 912, and interconnect lines 914. Not all of the floating gate driver transistors, 901-1, 901-2, . . . , 901-N, are operatively conductive in the first logic plane. Rather, the floating gate driver transistors, 901-1, 901-2, . . . , 901-N, are selectively programmed, as described in detail below, to respond to the input lines 912 and change the potential of the interconnect lines 914 so as to implement a desired logic function. This selective interconnection is referred to as programming since the logical function implemented by the programmable logic array is entered into the array by the floating gate driver transistors, 901-1, 901-2, . . . , 901-N, that are used at the intersections of input lines 912, and interconnect lines 914 in the array.

In this embodiment, each of the interconnect lines 914 acts as a NOR gate for the input lines 912 that are connected to the interconnect lines 914 through the floating gate driver transistors, 901-1, 901-2, . . . , 901-N, of the array 900. For example, interconnection line 914A acts as a NOR gate for the signals on input lines 912A, 912B and 912C. Programmability of the vertical floating gate driver transistors, 901-1, 901-2, . . . , 901-N is achieved by charging the vertical floating gates. When the vertical floating gate is charged, that floating gate driver transistor, 901-1, 901-2, . . . , 901-N will remain in an off state until it is reprogrammed. Applying and removing a charge to the vertical floating gates is performed by tunneling charge between the floating gate and control gates of the floating gate driver transistors, 901-1, 901-2, . . . , 901-N through a low tunnel barrier interpoly, or intergate insulator as described in detail above and in connection with FIGS. 2–7C. A floating gate driver transistors, 901-1, 901-2, . . . , 901-N programmed in an off state remains in that state until the charge is removed from its vertical floating gate.

Floating gate driver transistors, 901-1, 901-2, . . . , 901-N not having a corresponding vertical floating gate charged operate in either an on state or an off state, wherein input signals received by the input lines 912A, 912B and 912C determine the applicable state. If any of the input lines 912A, 912B and 912C are turned on by input signals received by the input lines 912A, 912B and 912C, then a ground is provided to load device transistors 916. The load device transistors 916 are attached to the interconnect lines 914.

The load device transistors 916 provide a low voltage level when any one of the floating gate driver transistors, 901-1, 901-2, . . . , 901-N connected to the corresponding interconnect line 914 is activated. This performs the NOR logic circuit function, an inversion of the OR circuit function results from inversion of data onto the interconnect lines 914 through the floating gate driver transistors, 901-1, 901-2, . . . , 901-N of the array 900. When the floating gate driver transistors, 901-1, 901-2, . . . , 901-N are in an off state, an open is provided to the drain of the load device transistors 916. The VDD voltage level is applied to corresponding input lines, e.g. the interconnect lines 914 for second logic plane 922 when a load device transistors 916 is turned on by a clock signal received at the gate of the load device transistors 916 (Φ). Each of the floating gate driver transistors, 901-1, 901-2, . . . , 901-N described herein are formed according to the teachings of the present invention as described in detail in connection with FIGS. 2–7C.

In a similar manner, second logic plane 922 comprises a second array of floating gate driver transistors, 902-1, 902-2, . . . , 902-N that are selectively programmed to provide the second level of the two level logic needed to implement a specific logical function. In this embodiment, the array of floating gate driver transistors, 902-1, 902-2, . . . , 902-N is also configured such that the output lines 920 comprise a logical NOR function of the signals from the interconnection lines 914 that are coupled to particular output lines 920 through the floating gate driver transistors, 902-1, 902-2, . . . , 902-N of the second logic plane 922.

Programmability of the vertical floating gate driver transistors, 902-1, 902-2, . . . , 902-N is achieved by charging the vertical floating gate. When the vertical floating gate is charged, that floating gate driver transistor, 902-1, 902-2, . . . , 902-N will remain in an off state until it is reprogrammed. Applying and removing a charge to the vertical floating gates is performed by tunneling charge between the floating gate and control gates of the floating gate driver transistors, 901-1, 901-2, . . . , 901-N through a low tunnel barrier interpoly, or intergate insulator as described in detail above and in connection with FIGS. 2–7C. A floating gate driver transistors, 902-1, 902-2, . . . , 902-N programmed in an off state remains in that state until the charge is removed from the vertical floating gate.

Floating gate driver transistors, 902-1, 902-2, . . . , 902-N not having a corresponding vertical floating gate charged operate in either an on state or an off state, wherein signals received by the interconnect lines 914 determine the applicable state. If any of the interconnect lines 914 are turned on, then a ground is provided to load device transistors 924 by applying a ground potential to the source line or conductive source plane coupled to the transistors first source/drain region as described herein. The load device transistors 924 are attached to the output lines 920. The load device transistors 924 provide a low voltage level when any one of the floating gate driver transistors, 902-1, 902-2, . . . , 902-N connected to the corresponding output line is activated. This performs the NOR logic circuit function, an inversion of the OR circuit function results from inversion of data onto the output lines 920 through the floating gate driver transistors, 902-1, 902-2, . . . , 902-N of the array 900. When the floating gate driver transistors, 902-1, 902-2, . . . , 902-N are in an off state, an open is provided to the drain of the load device transistors 924. The VDD voltage level is applied to corresponding output lines 920 for second logic plane 922 when a load device transistor 924 is turned on by a clock signal received at the gate of the load device transistors 924 (Φ). In this manner a NOR-NOR electrically programmable logic array is most easily implemented utilizing the normal PLA array structure. Each of the floating gate driver transistors, 902-1, 902-2, ..., 902-N described herein are formed according to the teachings of the present invention as described in detail in connection with FIGS. 2–7C.

Thus FIG. 9 shows the application of the novel, non-volatile floating gate transistors with low tunnel barrier intergate insulators in a logic array. If a floating gate driver transistors, 901-1, 901-2, ..., 901-N, and 902-1, 902-2, ..., 902-N, is programmed with a negative charge on the vertical floating gate it is effectively removed from the array. In this manner the array logic functions can be programmed even when the circuit is in the final circuit or in the field and being used in a system.

The absence or presence of stored charge on the floating gates is read by addressing the input lines 912 or control gate lines and y-column/sourcelines to form a coincidence in address at a particular floating gate. The control gate line would for instance be driven positive at some voltage of 1.0 Volts and the y-column/sourceline grounded, if the floating gate is not charged with electrons then the transistor would turn on tending to hold the interconnect line on that particular row down indicating the presence of a stored "one" in the cell. If this particular floating gate is charged with stored electrons, the transistor will not turn on and the presence of a stored "zero" indicated in the cell. In this manner, data stored on a particular floating gate can be read.

Programming can be achieved by hot electron injection. In this case, the interconnect lines, coupled to the second source/drain region for the non-volatile memory cells in the first logic plane, are driven with a higher drain voltage like 2 Volts for 0.1 micron technology and the control gate line is addressed by some nominal voltage in the range of twice this value. Electrons can also be transfered between the floating gate and the control gate through the low tunnel barrier intergate insulator to selectively program the non-volatile memory cells, according to the teachings of the present invention, by the address scheme as described above in connection with FIGS. 6A–6C. Erasure is accomplished by driving the control gate line with a large positive voltage and the sourceline and/or backgate or substrate/well address line of the transistor with a negative bias so the total voltage difference is in the order of 3 Volts causing electrons to tunnel off of the floating gates to the control gates. Writing can be performed, as also described above, by either normal channel hot electron injection, or according to the teachings of the present invention, by driving the control gate line with a large negative voltage and the the sourceline and/or backgate or substrate/well address line of the transistor with a positive bias so the total voltage difference is in the order of 3 Volts causing electrons to tunnel off of the control gates to the floating gates. According one embodiment of the present invention, data can be erased in "bit pairs" since both floating gates on each side of a control gate can be erased at the same time. This architecture is amenable to block address schemes where sections of the array are erased and reset at the same time.

One of ordinary skill in the art will appreciate upon reading this disclosure that a number of different configurations for the spatial relationship, or orientation of the input lines 912, interconnect lines 914, and output lines 920 are possible. That is, the spatial relationship, or orientation of the input lines 912, interconnect lines 914, and output lines 920 can parallel the spatial relationship, or orientation configurations detailed above for the floating gates and control gates as described in connection with FIGS. 5A–5E.

Figure 10:
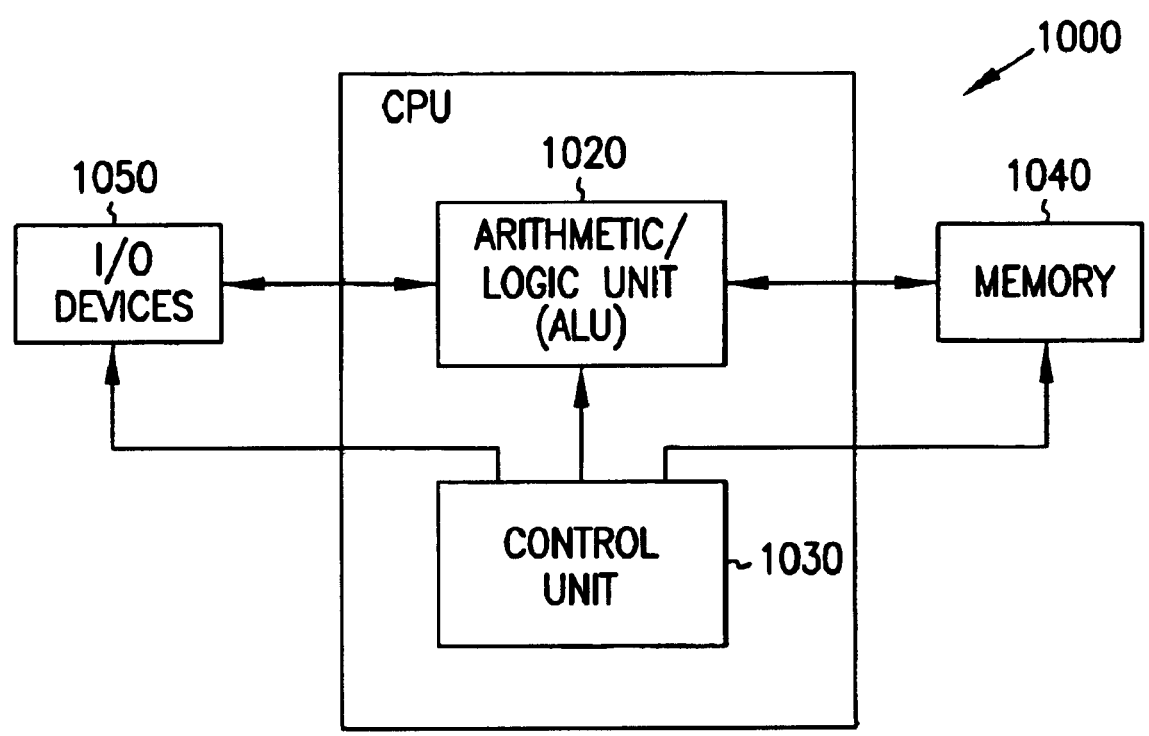
FIG. 10 is a simplified block diagram of a high-level organization of an electronic system according to the teachings of the present invention.

FIG. 10 is a simplified block diagram of a high-level organization of an electronic system 1000 according to the teachings of the present invention. As shown in FIG. 10, the electronic system 1000 is a system whose functional elements consist of an arithmetic/logic unit (ALU), e.g. processor 1020, a control unit 1030, a memory unit 1040, or memory device 1040, and an input/output (I/O) device 1050. Generally such an electronic system 1000 will have a native set of instructions that specify operations to be performed on data by the ALU 1020 and other interactions between the ALU 1020, the memory device 1040 and the I/O devices 1050. The memory devices 1040 contain the data plus a stored list of instructions.

The control unit 1030 coordinates all operations of the ALU 1020, the memory device 1040 and the I/O devices 1050 by continuously cycling through a set of operations that cause instructions to be fetched from the memory device 1040 and executed. In service programmable logic arrays, according to the teachings of the present invention, can be implemented to perform many of the logic functions performed by these components. With respect to the ALU 1020, the control unit 1030 and the I/O devices 1050, arbitrary logic functions may be realized in the "sum-of-products" form that is well known to one skilled in the art. A logic function sum-of-products may be implemented using any of the equivalent two-level logic configurations: AND-OR, NAND-NAND, NOR-OR, OR-NOR, AND-NOR, NAND-AND or OR-AND, and using the novel non-volatile memory cells of the present invention.

CONCLUSION

The above structures and fabrication methods have been described, by way of example and not by way of limitation, with respect to in service programmable logic arrays using non-volatile memory cells with low tunnel barrier interpoly insulators.

It has been shown that the low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the low tunnel barrier interploy dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

According to the teachings of the present invention, any arbitrary combinational logic function can be realized in the so-called sum-of-products form. A sum of products may be implemented by using a two level logic configuration such as the NOR-NOR arrays shown in FIG. 10, or by a combination of NOR gates and NAND gates. A NAND gate can be realized by a NOR gate with the inputs inverted. By programming the floating gates of the non-volatile memory cells in the array, these arrays can be field programmed or erased and re-programmed to accomplish the required logic functions.

DOCUMENTS

U.S. Pat. No. 6,498,065, "Memory Address Decode Array with vertical transistors;"
U.S. Pat. No. 5,691,230, "Technique for Producing Small Islands of Silicon on Insulator;"
U.S. Pat. No. 6,424,001, "Flash Memory with Ultrathin Vertical Body Transistors;"
S. R. Pollack and C. E. Morris, "Tunneling through gaseous oxidized films of Al2O3, " Trans. AIME, Vol. 233, p. 497, 1965;
O. Kubaschewski and B. E. Hopkins, "Oxidation of Metals and Alloys," Butterworth, London, pp. 53–64, 1962;
J. M. Eldridge and J. Matisoo, "Measurement of tunnel current density in a Meal-Oxide-Metal system as a function of oxide thickness," Proc. 12th Intern. Conf. On Low Temperature Physics, pp. 427–428, 1971;
J. M. Eldridge and D. W. Wong, "Growth of thin PbO layers on lead films. I. Experiment," Surface Science, Vol. 40, pp. 512–530, 1973;
J. H. Greiner, "Oxidation of lead films by rf sputter etching in an oxygen plasma," J. Appl. Phys., Vol. 45, No. 1, pp. 32–37, 1974;
S. M. Sze, Physics of Semiconductor Devices, Wiley, N.Y., pp. 553–556, 1981;
G. Simmons and A. El-Badry, "Generalized formula for the electric tunnel effect between similar electrodes separated by a thin insulating film," J. Appl. Phys., Vol. 34, p. 1793, 1963;
Z. Hurych, "Influence of nonuniform thickness of dielectric layers on capacitance and tunnel circuits," Solid-State Electronics, Vol. 9, p. 967, 1966;
S. P. S. Arya and H. P. Singh, "Conduction properties of Al2O3 films," Thin solid Films, vol. 91, No. 4, pp. 363–374, May, 1982;
K.-H. Gundlach and J. Holzl, "Logarithmic conductivity of Al-Al2O3-AL tunneling junctions produced by plasma- and by thermal-oxidation," Surface Science, Vol. 27, pp. 125–141, 1971;
J. Grimblot and J. M. Eldridge, "I. Interaction of Al films with O2 at low pressures," J. Electro. Chem. Soc., Vol. 129, No. 10, pp. 2366–2368, 1982;
J. Grimblot and J. M. Eldridge, "II. Oxidation of Al films," J. Electro. Chem. Soc., Vol. 129, No. 10, pp. 2369–2372, 1982;
J. M. Greiner, "Josephson tunneling barriers by rf sputter etching in an oxygen plasma," J. Appl. Phys., Vol. 42, No. 12, pp. 5151–5155, 1971;
U.S. Pat. No. 4,412,902, "Method of fabrication of Josephson tunnel junction;"
H. F. Luan et al., "High quality Ta2O5 gate dielectrics with Tox,eq<10 angstroms," IEDM Tech Digest, pp. 141–144, 1999;
U.S. Pat. No. 6,461,931, "Thin dielectric films for DRAM storage capacitors;"
U.S. Pat. No. 5,350,738, "Method of manufacturing an oxide superconducting film;"
Y. Shi et al., "Tunneling leakage current in ultrathin (<a4 nm) nitride/oxide stack dielectrics," IEEE Electron Device Letters, vol. 19, No. 10, pp/388–390, 1998;

What is claimed is:

1. A method for forming a programmable logic array, comprising:
    forming a first logic plane that receives a number of input signals, wherein forming the first logic plane includes forming a number of logic cells arranged in rows and columns that are interconnected to provide a number of logical outputs;
    forming a second logic plane, wherein forming the second logic plane includes forming a number of logic cells arranged in rows and columns that receive the outputs of the first logic plane and that are interconnected to produce a number of logical outputs such that the programmable logic array implements a logical function; and
    wherein forming each of the logic cells includes;
        forming a first source/drain region and a second source/drain region separated by a channel region in a substrate;
        forming a polysilicon floating gate opposing the channel region and separated therefrom by a gate oxide, the floating gate having a metal layer:
        forming a control gate opposing the floating gate; and
        forming a low tunnel barrier intergate insulator to separate the control gate from the floating gate, the low tunnel barrier intergate insulator in contact with the metal layer of the floating gate.

2. The method of claim 1, wherein forming the low tunnel barrier intergate insulator includes forming a metal oxide insulator selected from the group consisting of lead oxide (PbO) and aluminum oxide ($Al_2O_3$).

3. The method of claim 1, wherein forming the low tunnel barrier intergate insulator includes forming a transition metal oxide insulator.

4. The method of claim 3, wherein forming the transition metal oxide insulator includes forming the transition metal oxide insulator selected from the group consisting of $Ta_2O_5$, $TiO_2$, $ZrO_2$, and $Nb_2O_5$.

5. The method of claim 1, wherein forming the control gate includes a forming a polysilicon control gate having a metal layer formed thereon in contact with the low tunnel barrier intergate insulator.

6. The method of claim 1, wherein forming the first logic plane and the second logic plane each comprise forming NOR planes.

7. A method for forming an in service programmable logic array, comprising:
    forming a plurality of input lines for receiving an input signal;
    forming a plurality of output lines; and
    forming one or more arrays having a first logic plane and a second logic plane connected between the input lines and the output lines, wherein forming the first logic plane and the second logic plane forming a plurality of logic cells arranged in rows and columns for providing a sum-of-products term on the output lines responsive to the received input signal, wherein forming each logic cell includes forming a vertical non-volatile memory cell including:
        forming a vertical pillar extending outwardly from a semiconductor substrate at intersections of the input lines and interconnect lines and at the intersections of the interconnect lines and the output lines, wherein each pillar includes a first source/drain region, a body region, and a second source/drain region;
        forming a number of floating gates opposing the body regions in the number of pillars and separated therefrom by a gate oxide;
        forming a number of polysilicon control gates opposing the floating gates, the control gates having a metal layer;
        forming a low tunnel barrier intergate insulator to separate the control gate from the floating gate, the low tunnel barrier intergate insulator in contact with metal layer of the control gate; and forming a number of buried source lines formed of single crystalline semiconductor material and disposed below the pillars in the array for interconnecting with the first source/drain regions of column adjacent pillars in the array.

8. The electronic system of claim 7, wherein forming the low tunnel barrier intergate insulator includes forming a metal oxide insulator selected from the group consisting of PbO, $Al_2O_3$, $Ta_2O_5$, $TiO_2$, $ZrO_2$, and $Nb_2O_5$.

9. The electronic system of claim 7, wherein forming each floating gate includes forming a polysilicon floating gate having a metal layer formed thereon in contact with the low tunnel barrier intergate insulator.

10. The electronic system of claim 7, wherein forming each floating gate includes forming a vertical floating gate formed in a trench below a top surface of each pillar such that each trench houses a pair of floating gates opposing the body regions in adjacent pillars on opposing sides of the trench.

11. The electronic system of claim 10, wherein forming the number of control gates includes forming the control gates in the trench below the top surface of the pillar and between the pair of floating gates, wherein each pair of floating gates shares a single control gate line, and wherein each floating gate includes a vertically oriented floating gate having a vertical length of less than 100 nanometers.

12. The electronic system of claim 10, wherein forming the number of control gates includes forming the control gates in the trench below the top surface of the pillar and between the pair of floating gates such that each trench houses a pair of control gates each addressing the floating gates one on opposing sides of the trench respectively, and wherein the pair of control gates are separated by an insulator layer.

13. The electronic system of claim 10, wherein forming the number of control gates includes forming the control gates disposed vertically above the floating gates, and wherein each pair of floating gates shares a single control gate.

14. The electronic system of claim 10, wherein forming the number of control gates includes forming the control gates disposed vertically above the floating gates, and wherein each one of the pair of floating gates is addressed by an independent one of the number of control gates.

15. The electronic system of claim 7, wherein forming each floating gate includes forming a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

16. The electronic system of claim 15, wherein forming the number of control gates includes forming the control gates disposed vertically above the floating gates.

17. A method for operating an in-server programmable logic array, comprising:

writing to one or more floating gates of a number of non-volatile memory cells in one or more arrays using channel hot electron injection, the one or more arrays having a first logic plane and a second logic plane connected between a number of input lines and a number of output lines, wherein number of non-volatile memory cells in the first logic plane and the second logic plane are arranged in rows and columns for providing a sum-of-products term on the output lines responsive to the received input signal on the input lines, wherein each non-volatile memory cell includes:

a first source/drain region and a second source/drain region separated by a channel region in a substrate;
a floating gate opposing the channel region and separated therefrom by a gate oxide;
a control gate opposing the floating gate; and
wherein the control gate is separated from the floating gate by a low tunnel barrier intergate insulator;

erasing charge from one or more floating gates by tunneling electrons off of the floating gate and onto the control gate.

18. The method of claim 17, wherein erasing charge from one or more floating gates by tunneling electrons off of the floating gates and onto the control gates further includes:

providing a negative voltage to the substrate of an addressed cell; and
providing a large positive voltage to the control gate of the addressed cell.

19. The method of claim 17, wherein the method further includes writing to one or more floating gates by tunneling electrons from the control gate to the floating gate in one or more addressed cells.

20. The method of claim 19, wherein writing to one or more floating gates by tunneling electrons from the control gate to the floating gate in one or more addressed cells further includes:

applying a positive voltage to the substrate of an addressed cell; and
applying a large negative voltage to the control gate of the addressed cell.

21. The method of claim 17, wherein erasing charge from the floating gate by tunneling electrons off of the floating gate and onto the control gate includes tunneling electrons from the floating gate to the control gate through a low tunnel barrier intergate insulator.

22. The method of claim 21, wherein tunneling electrons from the floating gate to the control gate through a low tunnel barrier intergate insulator includes tunneling electrons from the floating gate to the control gate through a low tunnel barrier intergate insulator selected from the group consisting of PbO, $Al_2O_3$, $Ta_2O_5$, $TiO_2$, $ZrO_2$, and $Nb_2O_5$.

23. The method of claim 21, wherein tunneling electrons from the floating gate to the control gate through a low tunnel barrier intergate insulator includes tunneling electrons from a metal layer formed on the floating gate in contact with the low tunnel barrier intergate insulator to a metal layer formed on the control gate and also in contact with the low tunnel barrier intergate insulator.

24. A method for operating an in-server programmable logic array, comprising:

writing to one or more floating gates of a number of non-volatile memory cells in one or more arrays using channel hot electron injection, the one or more arrays having a first logic plane and a second logic plane connected between a number of input lines and a number of output lines, wherein number of non-volatile memory cells in the first logic plane and the second logic plane are arranged in rows and columns for providing a sum-of-products term on the output lines responsive to the received input signal on the input lines, wherein each non-volatile memory cell includes:

a number of pillars extending outwardly from a substrate, wherein each pillar includes a first source/drain region, a body region, and a second source/drain region;
a number of floating gates opposing the body regions in the number of pillars and separated therefrom by a gate oxide;

a number of control gates opposing the floating gates;

a number of buried sourcelines disposed below the number of pillars and coupled to the first source/drain regions along a first selected direction in the array of non-volatile memory cells;

a number of control gate lines formed integrally with the number of control gates along a second selected direction in the array of non-volatile memory cells, wherein the number of control gates lines are separated from the floating gates by a low tunnel barrier intergate insulator; and a number of bitlines coupled to the second source/drain regions along a third selected direction in the array of non-volatile memory cells; and erasing charge from the one or more floating gates by tunneling electrons off of the one or more floating gates and onto the number of control gates.

25. The method of claim 24, wherein erasing charge from the one or more floating gates by tunneling electrons off of the floating gate and onto the number of control gate further includes:

providing a negative voltage to a substrate of one or more non-volatile memory cells; and providing a large positive voltage to the control gate for the one or more non-volatile memory cells.

26. The method of claim 25, wherein the method further includes erasing an entire row of non-volatile memory cells by providing a negative voltage to all of the substrates along an entire row of non-volatile memory cells and providing a large positive voltage to all of the control gates along the entire row of non-volatile memory cells.

27. The method of claim 25, wherein the method further includes erasing an entire block of non-volatile memory cells by providing a negative voltage to all of the substrates along multiple rows of non-volatile memory cells and providing a large positive voltage to all of the control gates along the multiple rows of non-volatile memory cells.

28. A method for forming an in service programmable logic array, comprising:

forming a plurality of input lines for receiving an input signal;

forming a plurality of output lines; and forming one or more arrays having a first logic plane and a second logic plane connected between the input lines and the output lines, wherein forming the first logic plane and the second logic plane forming a plurality of logic cells arranged in rows and columns for providing a sum-of-products term on the output lines responsive to the received input signal, wherein forming each logic cell includes forming a vertical non-volatile memory cell including:

forming a vertical pillar extending outwardly from a semiconductor substrate at intersections of the input lines interconnect lines and at the intersections of the interconnect lines and the output lines, wherein each pillar includes a first source/drain region, a body region, and a second source/drain region;

forming a number of floating gates opposing the body regions in the number of pillars and separated therefrom by a gate oxide;

forming a number of control gates opposing the floating gates;

forming a low tunnel barrier intergate insulator to separate the control gate from the floating gate, wherein forming the low tunnel barrier intergate insulator includes forming a metal oxide insulator selected from the group consisting of PbO, $Al_2O_3$, $Ta_2O_5$, $TiO_2$, $ZrO_2$, and $Nb_2O_5$; and forming a number of buried source lines formed of single crystalline semiconductor material and disposed below the pillars in the array for interconnecting with the first source/drain regions of column adjacent pillars in the array.

29. A method for forming an in service programmable logic array, comprising:

forming a plurality of input lines for receiving an input signal;

forming a plurality of output lines; and forming one or more arrays having a first logic plane and a second logic plane connected between the input lines and the output lines, wherein forming the first logic plane and the second logic plane forming a plurality of logic cells arranged in rows and columns for providing a sum-of-products term on the output lines responsive to the received input signal, wherein forming each logic cell includes forming vertical non-volatile memory cell including:

forming a vertical pillar extending outwardly from a semiconductor substrate at intersections of the input lines and interconnect lines and at the intersections of the interconnect lines and the output lines, wherein each pillar includes a first source/drain region, a body region, and a second source/drain region;

forming a number of floating gates opposing the body regions in the number of pillars and separated other from by a gate oxide;

forming a number of control gates opposing the floating gates, wherein forming each floating gate includes forming a polysilicon floating gate having a metal layer formed thereon in contact with the low tunnel barrier intergate insulator;

forming a low tunnel barrier intergate insulator to separate the control gate from the floating gate; and forming a number of buried source lines formed of single crystalline semiconductor material and disposed below the pillars in the array for interconnecting with the first source/drain regions of column adjacent pillars in the array.

30. The electronic system of claim 29, wherein forming the low tunnel barrier intergate insulator includes forming a metal oxide insulator selected from the group consisting of PbO, $Al_2O_3$, $Ta_2O_5$, $TiO_2$, $ZrO_2$, and $Nb_2O_5$.

31. A method for forming an in service programmable logic array, comprising:

forming a plurality of input lines for receiving an input signal;

forming a plurality of output lines; and forming one or more arrays having a first logic plane and a second logic plane connected between the input lines and the output lines, wherein forming the first logic plane and the second logic plane forming a plurality of logic cells arranged in rows and columns for providing a sum-of-products term on the output lines responsive to the received input signal, wherein forming each logic cell includes forming vertical non-volatile memory cell including:

forming a vertical pillar extending outwardly from a semiconductor substrate at intersections of the input lines and interconnect lines and at the intersections of the interconnect lines and the output lines, wherein each pillar includes a first source/drain region, a body region, and a second source/drain region;

forming a number of floating gates opposing the body regions in the number of pillars and separated therefrom by a gate oxide, wherein forming each floating gate includes forming a vertical floating gate formed in a trench below a top surface of each pillar such that each trench houses a pair of floating gates opposing the body regions in adjacent pillars on opposing sides of the trench;

forming a number of control gates opposing the floating gates, wherein forming each floating gate includes forming a polysilicon floating gate having a metal layer formed thereon in contact with the low tunnel barrier intergate insulator, wherein forming the number of control gates includes forming the control gates disposed vertically above the floating gates, and wherein each one of the pair of floating gates is addressed by an independent one of the number of control gates;

forming a low tunnel barrier intergate insulator to separate the control gate from the floating gate; and forming a number of buried source lines formed of single crystalline semiconductor material and disposed below the pillars in the array for interconnecting with the first source/drain regions of column adjacent pillars in the array.

* * * * *

UNITED STATES PATENT AND TRADEMARK OFFICE
CERTIFICATE OF CORRECTION

| | | |
|---|---|---|
| PATENT NO. | : 7,074,673 B2 | Page 1 of 1 |
| APPLICATION NO. | : 10/788810 | |
| DATED | : July 11, 2006 | |
| INVENTOR(S) | : Forbes | |

It is certified that error appears in the above-identified patent and that said Letters Patent is hereby corrected as shown below:

On the Title page, item (54) and Col. 1, in "Title", in column 1, line 1, before "SERVICE" insert --IN--.

On the. Title page, item (73), in "Assignee", in column 1, line 1, after "ID" insert --83716--.

On page 2, item (56), under "Other Publications", in column 2, line 7, delete "thin" and insert -- Thin --, therefor.

In column 1, line 1, before "SERVICE" insert -- IN --.

In column 2, line 66, delete "interplay" and insert -- interploy --, therefor.

In column 24, line 13, in Claim 1, delete "layer:" and insert -- layer; --, therefor.

In column 27, line 55, in Claim 28, delete "lines interconnected" and insert -- lines and interconnected --, therefor.

In column 28, line 19, in Claim 29, delete "forming" and insert -- forming a --, therefor.

In column 28, lines 29-30, in Claim 29, delete "otherfrom" and insert -- therefrom --, therefor.

In column 28, line 59, in Claim 31, delete "forming" and insert -- forming a --, therefor.

Signed and Sealed this

Fifth Day of December, 2006

JON W. DUDAS
*Director of the United States Patent and Trademark Office*